(12) United States Patent
Endo et al.

(10) Patent No.: US 8,476,719 B2
(45) Date of Patent: Jul. 2, 2013

(54) SEMICONDUCTOR DEVICE AND METHOD OF MANUFACTURING THE SAME

(75) Inventors: Yuta Endo, Kanagawa (JP); Toshinari Sasaki, Kanagawa (JP); Kosei Noda, Kanagawa (JP); Mizuho Sato, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 90 days.

(21) Appl. No.: 13/110,241

(22) Filed: May 18, 2011

(65) Prior Publication Data

US 2011/0284846 A1 Nov. 24, 2011

(30) Foreign Application Priority Data

May 21, 2010 (JP) ................................ 2010-117753

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl.
USPC ...... 257/412; 257/43; 257/410; 257/E21.006; 257/E21.007; 257/E21.051; 257/E21.077; 257/E21.218; 257/E21.267; 257/E21.311; 257/E21.319; 257/E21.352

(58) Field of Classification Search
USPC ............... 257/43, 55, 69, 192, 213, 347, 411, 257/412, 410, E21.006, E21.007, E21.051, 257/E21.077, E21.17, E21.218, E21.267, 257/E21.311, E21.319, E21.352
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| | | |
|---|---|---|
| CN | 101882630 | 11/2010 |
| EP | 1737044 A | 12/2006 |

(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — David Nhu
(74) *Attorney, Agent, or Firm* — Eric J. Robinson; Robinson Intellectual Property Law Office, P.C.

(57) ABSTRACT

Oxygen is released from the insulating layer, whereby oxygen deficiency in the oxide semiconductor layer and an interface state between the insulating layer and the oxide semiconductor layer can be reduced. Accordingly, a semiconductor device where reliability is high and variation in electric characteristics is small can be manufactured.

16 Claims, 21 Drawing Sheets

U.S. PATENT DOCUMENTS

| | | |
|---|---|---|
| 7,064,346 B2 | 6/2006 | Kawasaki et al. |
| 7,098,087 B2 | 8/2006 | Akimoto et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,058 B2 * | 7/2009 | Yamazaki et al. ............... 257/72 |
| 7,651,896 B2 | 1/2010 | Honda et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,923,723 B2 | 4/2011 | Hayashi et al. |
| 7,977,168 B2 | 7/2011 | Honda et al. |
| 8,129,719 B2 | 3/2012 | Yamazaki et al. |
| 8,193,031 B2 * | 6/2012 | Hosoba et al. ................ 438/104 |
| 8,274,079 B2 | 9/2012 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0261341 A1 | 11/2006 | Akimoto et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0057618 A1 | 3/2008 | Honda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0032668 A1 | 2/2010 | Yamazaki et al. |
| 2010/0051940 A1 | 3/2010 | Yamazaki et al. |
| 2010/0051949 A1 | 3/2010 | Yamazaki et al. |
| 2010/0059746 A1 | 3/2010 | Itai |
| 2010/0065844 A1 | 3/2010 | Tokunaga |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0184254 A1 | 7/2010 | Honda et al. |
| 2010/0295041 A1 | 11/2010 | Kumomi et al. |
| 2011/0006301 A1 | 1/2011 | Yamazaki et al. |
| 2011/0008930 A1 | 1/2011 | Sasaki et al. |
| 2011/0198586 A1 | 8/2011 | Inoue et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |
| 2011/0284844 A1 | 11/2011 | Endo et al. |
| 2011/0284845 A1 | 11/2011 | Endo et al. |
| 2011/0284847 A1 | 11/2011 | Endo et al. |
| 2011/0303913 A1 | 12/2011 | Yamazaki et al. |
| 2012/0122277 A1 | 5/2012 | Yamazaki et al. |

FOREIGN PATENT DOCUMENTS

| | | |
|---|---|---|
| EP | 2159845 A | 3/2010 |
| EP | 2226847 A | 9/2010 |
| JP | 56-116627 A | 9/1981 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2009-016469 A | 1/2009 |
| JP | 2009-065012 A | 3/2009 |
| JP | 2010-080947 A | 4/2010 |
| JP | 2010-080952 A | 4/2010 |
| KR | 2010-0027067 A | 3/2010 |
| WO | WO-2004/114391 | 12/2004 |
| WO | WO-2010/047077 | 4/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor,", IDW'08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al,, "The phase relations in the $In_2O_3$-$Ga_2ZnO_4$-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$-$ZnGa_2O_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using Igzo Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MOO_3$ as a Charge-Generating Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent Am-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT, ", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA Amoled Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.n. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] at Temperatures over 1000 ° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics ) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters ) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters ) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, Vol, 81, No. 5, pp. 501-515.

Hosono.H et al., "Working hypothesis to explore novel wide band gap electrically conducting amorphous oxides examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No, 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2011/061350) Dated Aug. 23, 2011.

Written Opinion (Application No. PCT/JP2011/061350) Dated Aug. 23, 2011.

Serikawa.T et al., "Ultra-thin silicon-oxide films by sputter-deposition and their application to high-quality poly-Si TFTS,", Vacuum, 1998, vol. 51, No. 4, pp. 781-783.

* cited by examiner

SEMICONDUCTOR DEVICE AND METHOD OF MANUFACTURING THE SAME

This application claims priority from Japanese Patent Application Serial No. 2010-117753 filed on May 21, 2010 in Japan.

TECHNICAL FIELD

The present invention relates to a semiconductor device and a method for manufacturing the semiconductor device.

In this specification, a semiconductor device means a general device which can function by utilizing semiconductor characteristics, and an electro-optic device, a semiconductor circuit, and an electronic device are all semiconductor devices.

BACKGROUND ART

A technique by which transistors are formed using semiconductor thin films formed over a substrate having an insulating surface has been attracting attention. Such transistors are applied to a wide range of electronic devices such as an integrated circuit (IC) or an image display device (display device). As materials of semiconductor thin films applicable to the transistors, silicon-based semiconductor materials have been widely used, but oxide semiconductors have been attracting attention as alternative materials.

For example, disclosed is a transistor whose active layer is formed using an amorphous oxide containing indium (In), gallium (Ga), and zinc (Zn) and having an electron carrier concentration of less than $10^{18}/cm^3$ (see Patent Document 1).

A transistor including an oxide semiconductor is known to have a problem of low reliability because of high possibility of fluctuation in electric characteristics, although the transistor including an oxide semiconductor can operate at higher speed than a transistor including amorphous silicon and can be manufactured more easily than a transistor including polycrystalline silicon. For example, the threshold voltage of the transistor fluctuates between before and after a bias-temperature test (BT test). Note that in this specification, a threshold voltage refers to a gate voltage which is needed to turn on the transistor. "Gate voltage" refers to a potential difference between a source and a gate when the potential of the source is used as a reference potential.

[Reference]
[Patent Document]
[Patent Document 1] Japanese Published Patent Application No. 2006-165528

DISCLOSURE OF INVENTION

Fluctuation in the threshold voltage due to a BT test of the transistor including an oxide semiconductor reduces the reliability of the transistor including an oxide semiconductor. An object of one embodiment of the present invention is to improve reliability of a semiconductor device including an oxide semiconductor.

One embodiment of the present invention is a semiconductor device or a method for manufacturing the semiconductor device which is based on the technical idea to form an insulating layer containing a silicon peroxide radical as an insulating layer in contact with an oxide semiconductor layer in a transistor including an oxide semiconductor.

In silicon oxide, silicon is stable in a form of $(O-)_3Si-O$; however, a radical like $(O-)_3Si$. is formed when one of the oxygen atoms is eliminated by heat or the like. When $O_2$ is bonded here, $(O-)_3Si-O-O$. (a silicon peroxide radical) is formed. The silicon peroxide radical becomes a stable state when oxygen is supplied outside of the silicon peroxide radical.

"Containing a silicon peroxide radical" in a material including silicon oxide means that signals can be seen at g value=2.0078 and 2.0016 in a spectrum obtained by an electron spin resonance (ESR) method.

One embodiment of the present invention is a semiconductor device or a method for manufacturing the semiconductor device which is based on the technical idea to form an insulating layer containing a silicon peroxide radical as a base insulating layer and a gate insulating layer in a top-gate transistor including an oxide semiconductor.

When a silicon peroxide radical is contained in the base insulating layer, it is possible to sufficiently suppress trapping of a charge or the like, which can be generated due to the operation of a semiconductor device, or the like, at an interface between the base insulating layer and an oxide semiconductor layer. This advantageous effect is brought about because an interface state between the oxide semiconductor layer and the base insulating layer can be reduced by supplying oxygen from the base insulating layer to the oxide semiconductor layer.

In addition, when a silicon peroxide radical is contained in the gate insulating layer, it is possible to sufficiently suppress trapping of a charge or the like, which can be generated due to the operation of a semiconductor device, or the like, at an interface between the gate insulating layer and the oxide semiconductor layer. This advantageous effect is brought about because an interface state between the oxide semiconductor layer and the gate insulating layer can be reduced by supplying oxygen from the gate insulating layer to the oxide semiconductor layer.

Further, a charge is caused due to oxygen deficiency in the oxide semiconductor layer in some cases. In general, the oxygen deficiency in the oxide semiconductor layer becomes donors and generates electrons which are carriers. As a result, the threshold voltage of the transistor is shifted in a negative direction. Oxygen is supplied to the oxygen deficiency in the oxide semiconductor layer from the base insulating layer and the gate insulating layer, whereby the shift of the threshold voltage in a negative direction can be suppressed.

In other words, when oxygen deficiency is caused in an oxide semiconductor layer, it is difficult to suppress trapping of a charge at an interface between a base insulating layer and an oxide semiconductor layer and an interface between a gate insulating layer and the oxide semiconductor layer. However, by providing the base insulating layer containing a silicon peroxide radical and the gate insulating layer containing a silicon peroxide radical, the interface state and the oxygen deficiency in the oxide semiconductor layer can be reduced and the adverse effect of the trapping of a charge at the interface between the base insulating layer and the oxide semiconductor layer can be made small.

Thus, the advantageous effect according to one embodiment of the present invention is attributed to the base insulating layer containing a silicon peroxide radical and the gate insulating layer containing a silicon peroxide radical.

In one embodiment of the present invention, one of the base insulating layer containing a silicon peroxide radical and the gate insulating layer containing a silicon peroxide radical may be included. Both the base insulating layer containing a silicon peroxide radical and the gate insulating layer containing a silicon peroxide radical are preferably included.

Since the trapping of a charge at the interface between the base insulating layer and the oxide semiconductor layer and the interface between the gate insulating layer and the oxide semiconductor layer can be suppressed, which is described above as the advantageous effect, malfunctions such as increase of an off-state current of the transistor including an oxide semiconductor and fluctuation in the threshold voltage can be suppressed, and further the reliability of the semiconductor device can be improved.

Note that the base insulating layer containing a silicon peroxide radical preferably has an enough thickness with respect to the thickness of the oxide semiconductor layer. This is because oxygen is insufficiently supplied to the oxide semiconductor layer in some cases when the thickness of the base insulating layer containing a silicon peroxide radical is small with respect to the thickness of the oxide semiconductor layer.

One embodiment of the present invention is a semiconductor device including a base insulating layer, an oxide semiconductor layer, a source electrode and a drain electrode electrically connected to the oxide semiconductor layer, a gate insulating layer partly in contact with the oxide semiconductor layer, and a gate electrode over the gate insulating layer, and at least one of the base insulating layer and the gate insulating layer contains a silicon peroxide radical.

In the above structure, the base insulating layer can be formed using silicon oxide, silicon oxynitride, silicon nitride oxide, aluminum oxide, or a stacked layer including any of these. The gate insulating layer can be formed using silicon oxide, silicon oxynitride, aluminum oxide, hafnium oxide, or a stacked layer including any of these. Note that the base insulating layer and the gate insulating layer on the side in contact with the oxide semiconductor layer are formed using silicon oxide or silicon oxynitride.

In this specification, silicon oxynitride refers to a substance that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. Further, silicon nitride oxide refers to a substance that contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that rates of oxygen, nitrogen, silicon, and hydrogen fall within the above ranges in the cases where measurement is performed using Rutherford backscattering spectrometry (RBS) or hydrogen forward scattering spectrometry (HFS). In addition, the total of the percentages of the constituent elements does not exceed 100 atomic %.

In the above structure, a protective insulating layer which covers the gate insulating layer and the gate electrode may be provided in some cases. Further, a conductive layer may be provided below the oxide semiconductor layer in some cases.

One embodiment of the present invention is a semiconductor device or a method for manufacturing the semiconductor device which is based on the technical idea to form an insulating layer containing a silicon peroxide radical as a gate insulating layer and a protective insulating layer in a bottom-gate transistor including an oxide semiconductor.

When a silicon peroxide radical is contained in the protective insulating layer, it is possible to sufficiently suppress trapping of a charge or the like, which can be generated due to the operation of a semiconductor device, or the like, at an interface between the protective insulating layer and an oxide semiconductor layer. This advantageous effect is brought about because an interface state between the oxide semiconductor layer and the protective insulating layer can be reduced by supplying oxygen from the protective insulating layer to the oxide semiconductor layer.

In addition, when a silicon peroxide radical is contained in the gate insulating layer, it is possible to sufficiently suppress trapping of a charge or the like, which can be generated due to the operation of a semiconductor device, or the like, at an interface between the gate insulating layer and the oxide semiconductor layer. This advantageous effect is brought about because an interface state between the oxide semiconductor layer and the gate insulating layer can be reduced by supplying oxygen from the gate insulating layer to the oxide semiconductor layer.

Oxygen is supplied to the oxygen deficiency in the oxide semiconductor layer from the protective insulating layer and the gate insulating layer, whereby the shift of the threshold voltage in a negative direction can be suppressed.

In other words, when oxygen deficiency is caused in an oxide semiconductor layer, it is difficult to suppress trapping of a charge at an interface between a protective insulating layer and an oxide semiconductor layer and an interface between a gate insulating layer and the oxide semiconductor layer. However, by providing the protective insulating layer containing a silicon peroxide radical and the gate insulating layer containing a silicon peroxide radical, the interface state and the oxygen deficiency in the oxide semiconductor layer can be reduced and the adverse effect of the trapping of a charge at the interface between the protective insulating layer and the oxide semiconductor layer can be made small.

Thus, the advantageous effect according to one embodiment of the present invention is attributed to the protective insulating layer containing a silicon peroxide radical and the gate insulating layer containing a silicon peroxide radical.

In one embodiment of the present invention, one of the protective insulating layer containing a silicon peroxide radical and the gate insulating layer containing a silicon peroxide radical may be included. Both the protective insulating layer containing a silicon peroxide radical and the gate insulating layer containing a silicon peroxide radical are preferably included.

Since the trapping of a charge at the interface between the protective insulating layer and the oxide semiconductor layer and the interface between the gate insulating layer and the oxide semiconductor layer can be suppressed, which is described above as the advantageous effect, malfunctions such as increase of an off-state current of the transistor including an oxide semiconductor and fluctuation in the threshold voltage can be suppressed, and further the reliability of the semiconductor device can be improved.

Note that the protective insulating layer containing a silicon peroxide radical preferably has an enough thickness with respect to the thickness of the oxide semiconductor layer. This is because oxygen is insufficiently supplied to the oxide semiconductor layer in some cases when the thickness of the protective insulating layer containing a silicon peroxide radical is small with respect to the thickness of the oxide semiconductor layer.

One embodiment of the present invention is a semiconductor device including a base insulating layer, a gate electrode, a gate insulating layer, an oxide semiconductor layer which is over the gate electrode with the gate insulating layer interposed therebetween, a source electrode and a drain electrode electrically connected to the oxide semiconductor layer, and a protective insulating layer which is over the source electrode and the drain electrode and partly in contact with the oxide semiconductor layer, and at least one of the protective insulating layer and the gate insulating layer contains a silicon peroxide radical.

In the above structure, the protective insulating layer can be formed using silicon oxide, silicon oxynitride, silicon nitride oxide, aluminum oxide, or a stacked layer including any of these. The gate insulating layer can be formed using silicon oxide, silicon oxynitride, aluminum oxide, hafnium oxide, or a stacked layer including any of these. Note that the protective insulating layer and the gate insulating layer on the side in contact with the oxide semiconductor layer are formed using silicon oxide or silicon oxynitride.

Further, in the above structure, a conductive layer may be provided below the oxide semiconductor layer in some cases.

In each of the above structures, the channel length L of the transistor, which is determined by the distance between the source electrode and the drain electrode, can be greater than or equal to 10 nm and less than or equal to 10 μm, preferably 0.1 μm to 0.5 μm. It is needless to say that the channel length L may be greater than or equal to 10 μm. The channel width W can be greater than or equal to 10 μm.

According to one embodiment of the present invention, a transistor which has a small off-state current, less variation in the threshold voltage, and stable electrical characteristics can be provided by providing an insulating layer containing a silicon peroxide radical as an insulating layer in contact with an oxide semiconductor layer.

Alternatively, according to one embodiment of the present invention, a semiconductor device including a transistor, where electric characteristics are favorable and reliability is high, can be provided.

BEST MODE FOR CARRYING OUT THE INVENTION

Figure 1A:
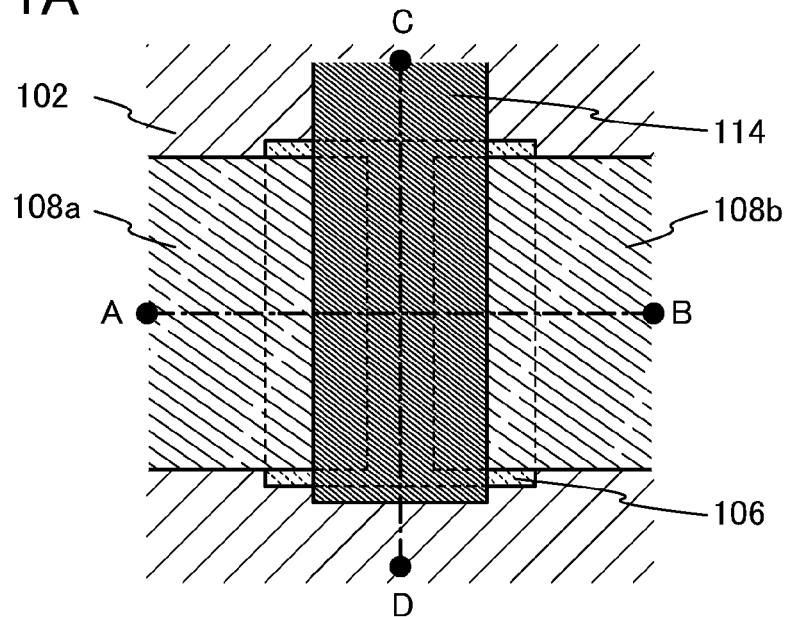
FIGS. 1A to 1C are a top view and cross-sectional views showing an example of a semiconductor device which is one embodiment of the present invention.

Hereinafter, embodiments of the present invention will be described in detail with reference to the accompanying drawings. However, the present invention is not limited to the description below and it is easily understood by those skilled in the art that the mode and details can be changed variously. Therefore, the present invention is not construed as being limited to description of the embodiments described below. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

[Embodiment 1]

In this embodiment, one embodiment of a semiconductor device and a method for manufacturing the semiconductor device will be described with reference to FIGS. 1A to 1C, FIGS. 2A to 2D, FIGS. 3A to 3E, FIGS. 4A to 4E, FIGS. 5A to 5E, FIGS. 6A to 6E, and FIGS. 7A to 7E.

Figure 1B:
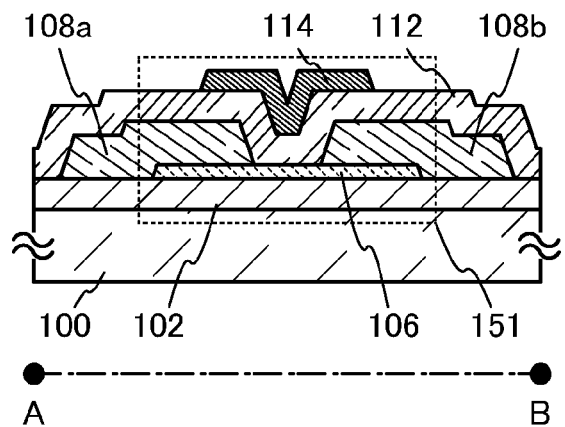
Figure 1C:
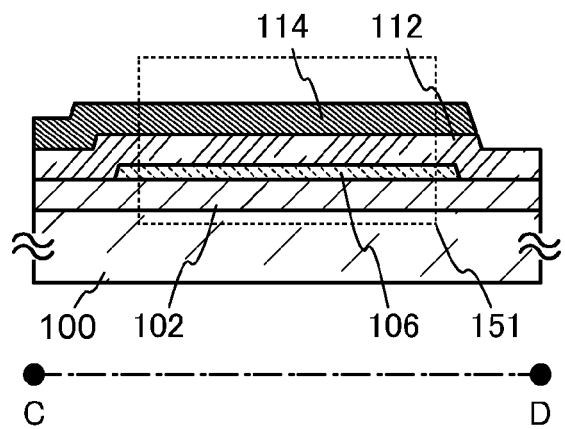

FIGS. 1A to 1C are a top view and cross-sectional views of a transistor 151 which is a top-gate top-contact type as an example of a semiconductor device according to one embodiment of the present invention. Here, FIG. 1A is a top view, FIG. 1B is a cross-sectional view along A-B of FIG. 1A, and FIG. 1C is a cross-sectional view along C-D of FIG. 1A. Note that in FIG. 1A, some of components of the transistor 151 (for example, a gate insulating layer 112) are omitted for brevity.

The transistor 151 in FIGS. 1A to 1C includes a base insulating layer 102, an oxide semiconductor layer 106, a source electrode 108a, a drain electrode 108b, the gate insulating layer 112, and a gate electrode 114 over a substrate 100.

As a material of the base insulating layer 102, silicon oxide, silicon oxynitride, or the like may be used. Alternatively, the base insulating layer 102 may be formed using a stacked layer of the above material and silicon oxide, silicon nitride, silicon oxynitride, silicon nitride oxide, aluminum oxide, aluminum nitride, a mixed material of any of them, or the like. For example, when the base insulating layer 102 has a stacked-layer structure of a silicon nitride layer, a silicon nitride oxide layer, an aluminum oxide layer, or an aluminum nitride layer, and a silicon oxide layer, entry of moisture from the substrate 100 or the like to the transistor 151 can be prevented. In the case where the base insulating layer 102 is formed to have a stacked-layer structure, a layer of silicon oxide or silicon oxynitride is preferably formed on a side where the base insulating layer 102 is in contact with the oxide semiconductor layer 106. Note that the base insulating layer 102 functions as a base layer of the transistor 151. Note that the base insulating layer 102 preferably contains a silicon peroxide radical. "Containing a silicon peroxide radical" in a material including silicon oxide means that signals can be seen at g value=2.0078 and 2.0016 in a spectrum obtained by an ESR method.

As a material used for the oxide semiconductor layer, an In—Sn—Ga—Zn—O-based material which is a four-component metal oxide; an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material which are three-component metal oxides; an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material which are two-component metal oxides; an In—O-based material; a Sn—O-based material; a Zn—O-based material; or the like can be used. Further, silicon oxide may be contained in the above material. Here, for example, an In—Ga—Zn—O-based material means an oxide layer containing indium (In), gallium (Ga), and zinc (Zn), and there is no particular limitation on the composition ratio. Further, the In—Ga—Zn—O-based oxide semiconductor may contain an element other than In, Ga, and Zn. As an example, in the case where an In—Zn—O-based material is used, any of the following is employed: In/Zn is greater than or equal to 0.5 and less than or equal to 50 in an atomic ratio, preferably In/Zn is greater than or equal to 1 and less than or equal to 20 in an atomic ratio, or more preferably In/Zn is greater than or equal to 1.5 and less than or equal to 15 in an atomic ratio. When the atomic ratio of Zn is in the above range, the field effect mobility of the transistor can be improved. Here, when the atomic ratio of the compound is In:Zn:O=X:Y:Z, it is preferable to satisfy the relation of Z>1.5X+Y.

For the oxide semiconductor layer, a thin film using a material represented by the chemical formula, $InMO_3(ZnO)_m$ (m>0), can be used. Here, M represents one or more metal elements selected from Ga, Al, Mn, and Co. For example, M can be Ga, Ga and Al, Ga and Mn, Ga and Co, or the like.

As an oxide semiconductor, the band gap of the material is preferably greater than or equal to 3 eV, more preferably greater than or equal to 3 eV and less than 3.6 eV. In addition, the electron affinity of the material is preferably greater than or equal to 4 eV, more preferably greater than or equal to 4 eV and less than 4.9 eV. Among such materials, a material whose carrier concentration derived from a donor or an acceptor is preferably lower than $1 \times 10^{14}$ cm$^{-3}$, more preferably lower than $1 \times 10^{11}$ cm$^{-3}$. Further, the hydrogen concentration in the oxide semiconductor layer is lower than $1 \times 10^{18}$ cm$^{-3}$, preferably lower than $1 \times 10^{16}$ cm$^{-3}$. The oxide semiconductor layer is i-type (intrinsic) by being highly purified. In a thin film transistor including the oxide semiconductor layer as an active layer, the off-state current can take an extremely low value of 1 zA (zetoampere, $10^{-21}$ A)

The oxygen deficiency in the oxide semiconductor layer 106 and the interface state between the base insulating layer 102 and the oxide semiconductor layer 106 can be reduced when the oxide semiconductor layer is in contact with the base insulating layer. By the reduction in the interface state, fluctuation in the threshold voltage after the BT test can be reduced.

It is preferable that the gate insulating layer 112 can have a structure similar to that of the base insulating layer 102 and be an insulating layer containing a silicon peroxide radical. At this time, a material having a high dielectric constant, such as hafnium oxide or aluminum oxide, may be used for part of the gate insulating layer 112 in consideration of the function of the gate insulating layer of the transistor. Alternatively, a stacked layer of silicon oxide, silicon oxynitride, or silicon nitride and a material having a high dielectric constant, such as hafnium oxide or aluminum oxide, may be used in consideration of a gate withstand voltage, a condition of an interface between the oxide semiconductor layer and the gate insulating layer 112, or the like. At this time, a layer of silicon oxide or silicon oxynitride is preferably formed on a side where the gate insulating layer 112 is in contact with the oxide semiconductor layer 106.

A protective insulating layer may further be provided over the transistor 151. The protective insulating layer can have a structure similar to that of the base insulating layer 102. In order to electrically connect the source electrode 108a or the drain electrode 108b and a wiring, an opening may be formed in the base insulating layer 102, the gate insulating layer 112, and the like. A second gate electrode may further be provided below the oxide semiconductor layer 106. Note that it is not always necessary but preferable to process the oxide semiconductor layer 106 into an island shape.

FIGS. 2A to 2D illustrate cross-sectional structures of transistors having different structures from that of the transistor 151.

Figure 2A:
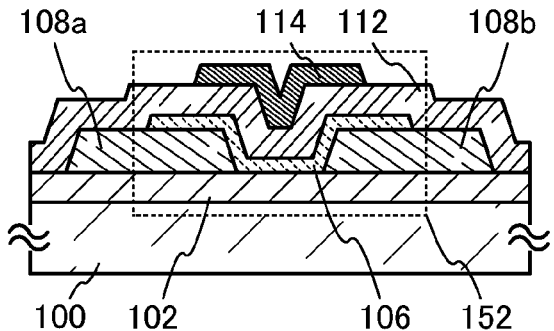
FIGS. 2A to 2D are cross-sectional views each showing an example of a semiconductor device which is one embodiment of the present invention.

A transistor 152 in FIG. 2A is the same as the transistor 151 in that it includes a base insulating layer 102, an oxide semiconductor layer 106, a source electrode 108a, a drain electrode 108b, a gate insulating layer 112, and a gate electrode 114. The differences between the transistor 152 and the transistor 151 are the positions where the oxide semiconductor layer 106 is connected to the source electrode 108a and the drain electrode 108b. That is, in the transistor 152, the source electrode 108a and the drain electrode 108b are in contact with bottom portions of the oxide semiconductor layer 106. The other components are similar to those of the transistor 151 in FIGS. 1A to 1C.

Figure 2B:
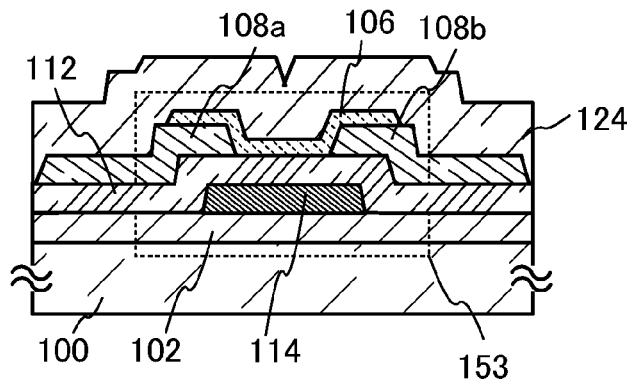

A transistor 153 in FIG. 2B is the same as the transistor 152 in that it includes a base insulating layer 102, an oxide semiconductor layer 106, a source electrode 108a, a drain electrode 108b, a gate insulating layer 112, and a gate electrode 114. The difference between the transistor 153 and the transistor 151 is the position of the gate electrode with respect to the oxide semiconductor layer 106. That is, in the transistor 153, the gate electrode is provided below the oxide semiconductor layer 106 with the gate insulating layer 112 interposed therebetween. In addition, in the transistor 153, a protective insulating layer 124 is provided so as to cover the source electrode 108a, the drain electrode 108b, and the oxide semiconductor layer 106. The other components are similar to those of the transistor 152 in FIG. 2A. In the transistor 153, the gate insulating layer 112 and the protective insulating layer 124 which are in contact with the oxide semiconductor layer 106 are each formed using an insulating layer containing a silicon peroxide radical.

Figure 2C:
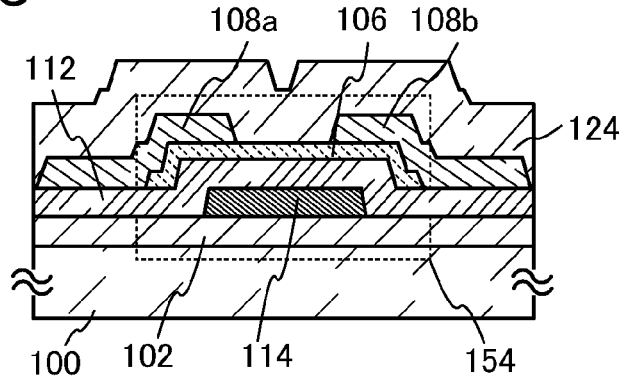

A transistor 154 in FIG. 2C is the same as the transistor 151 in that it includes a base insulating layer 102, an oxide semiconductor layer 106, a source electrode 108a, a drain electrode 108b, a gate insulating layer 112, and a gate electrode 114. The difference between the transistor 154 and the transistor 151 is the position of the gate electrode with respect to the oxide semiconductor layer 106. That is, in the transistor 154, the gate electrode is provided below the oxide semiconductor layer 106 with the gate insulating layer 112 interposed therebetween. In addition, in the transistor 154, a protective insulating layer 124 is provided so as to cover the source electrode 108a, the drain electrode 108b, and the oxide semiconductor layer 106. The other components are similar to those of the transistor 151 in FIGS. 1A to 1C. In the transistor 154, the gate insulating layer 112 and the protective insulating layer 124 which are in contact with the oxide semiconductor layer 106 are each formed using an insulating layer containing a silicon peroxide radical.

Figure 2D:
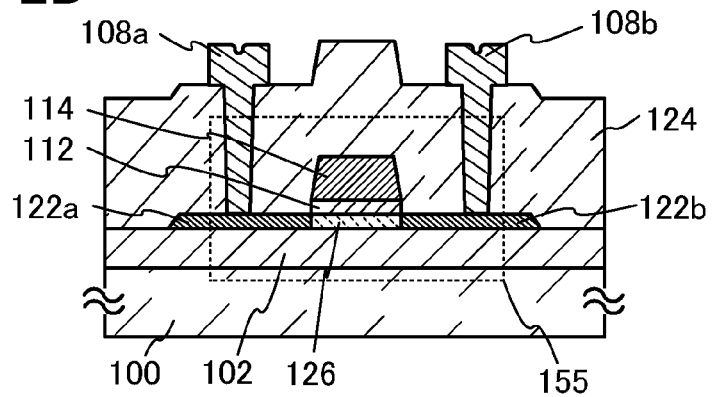

A transistor 155 in FIG. 2D is the same as the transistor 151 and the transistor 152 in that it includes a base insulating layer 102, a gate insulating layer 112, a gate electrode 114, a source electrode 108a, and a drain electrode 108b. The transistor 155 is different from the transistor 151 and the transistor 152 in that a channel region 126, a source region 122a, and a drain region 122b are formed in the oxide semiconductor layer in the same plane. The source region 122a and the drain region 122b are connected to the source electrode 108a and the drain electrode 108b, respectively, through opening provided in a protective insulating layer 124 interposed therebetween. Note that in FIG. 2D, the gate insulating layer 112 is provided only under the gate electrode 114; however, one embodiment of the present invention is not limited thereto. For example, the gate insulating layer 112 may be provided so as to cover the oxide semiconductor layer including the channel region 126, the source region 122a, and the drain region 122b.

Examples of a manufacturing process of the transistor in FIGS. 1A to 1C will be described below with reference to FIGS. 3A to 3E.

To begin with, an example of a manufacturing process of the transistor 151 in FIGS. 1A to 1C will be described with reference to FIGS. 3A to 3E.

Figure 3A:
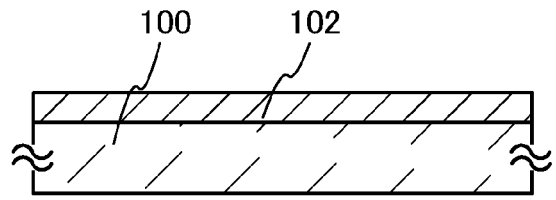
FIGS. 3A to 3E are cross-sectional views showing an example of a manufacturing process of a semiconductor device which is one embodiment of the present invention.

First, a base insulating layer 102 is formed over a substrate 100 (see FIG. 3A). In this embodiment, at least any one of insulating layers in contact with an oxide semiconductor layer, which include the base insulating layer 102, contains a silicon peroxide radical.

There is no particular limitation on the property of a material and the like of the substrate 100 as long as the material has heat resistance enough to withstand at least heat treatment to be performed later. For example, a glass substrate, a ceramic substrate, a quartz substrate, a sapphire substrate, or the like can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may be used as the substrate 100. In that case, a transistor can be formed directly on the flexible substrate. Note that as a method for forming a transistor over a flexible substrate, there is also a method in which, after a non-flexible substrate is used as the substrate 100 and a transistor is formed thereover, the transistor is separated from the substrate and transferred to a flexible substrate. In that case, a separation layer is preferably provided between the substrate 100 and the transistor.

As a formation method of the base insulating layer 102, a plasma CVD method or a sputtering method can be employed, for example. The base insulating layer containing a silicon peroxide radical is preferably formed by a sputtering method. As a material of the base insulating layer 102, silicon oxide, silicon oxynitride, or the like may be used. Alternatively, the base insulating layer 102 may be formed using a stacked layer of the above material and silicon oxide, silicon nitride, silicon oxynitride, silicon nitride oxide, aluminum oxide, aluminum nitride, a mixed material of any of them, or the like. In the case where the base insulating layer 102 is formed to have a stacked-layer structure, a layer of silicon oxide or silicon oxynitride is preferably formed on a side where the base insulating layer 102 is in contact with the oxide semiconductor layer 106. The total thickness of the base insulating layer 102 is preferably 20 nm or more, more preferably 100 nm or more. When the thick base insulating layer 102 is formed, the amount of silicon peroxide radicals of the base insulating layer 102 can be increased.

In order to form the insulating layer containing a silicon peroxide radical by a sputtering method, in the case where oxygen or a mixed gas of oxygen and a rare gas (such as helium, neon, argon, krypton, or xenon) is used as a film formation gas, the proportion of oxygen is preferably set higher. For example, the concentration of oxygen in the whole gas is preferably set to be higher than or equal to 6% and lower than 100%.

For example, a silicon oxide film is formed by an RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa), the high-frequency power is higher than or equal to 0.5 kW and lower than or equal to 12 kW (preferably higher than or equal to 1 kW and lower than or equal to 5 kW); and the proportion of oxygen ($O_2/(O_2+Ar)$) in the film formation gas is higher than or equal to 1% and lower than or equal to 100% (preferably higher than or equal to 6% and lower than or equal to 100%). Note that a silicon target may be used as the target instead of the quartz (preferably synthetic quartz) target. As the film formation gas, oxygen or a mixed gas of oxygen and argon is used.

Figure 3B:
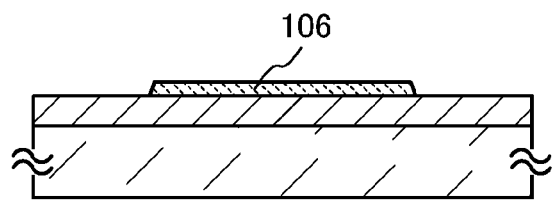

Next, an oxide semiconductor layer is formed over the base insulating layer 102 and processed to form the oxide semiconductor layer 106 having an island shape (see FIG. 3B).

For example, the oxide semiconductor layer can be formed by a sputtering method, a vacuum evaporation method, a pulse laser deposition method, a CVD method, or the like.

The thickness of the oxide semiconductor layer is preferably greater than or equal to 3 nm and less than or equal to 50 nm. This is because when the oxide semiconductor layer is too thick (e.g., 100 nm or more), there is a possibility that the short channel effect might have a large influence and the transistor with small size might be normally on. Here, "normally on" means a state where a channel exists without application of a voltage to a gate electrode and a current flows through the transistor. Note that the base insulating layer 102 and the oxide semiconductor layer are preferably formed successively without exposure to the air.

In this embodiment, the oxide semiconductor layer is formed by a sputtering method using an In—Ga—Zn—O-based oxide target.

As the In—Ga—Zn—O-based oxide target, for example, an oxide target having a composition ratio of $In_2O_3$:$Ga_2O_3$:$ZnO$=1:1:1 [molar ratio] can be used. Note that it is not necessary to limit the material and the composition ratio of the target to the above. For example, an oxide target having a composition ratio of $In_2O_3$:$Ga_2O_3$:$ZnO$=1:1:2 [molar ratio] can also be used.

The relative density of the oxide target is higher than or equal to 90% and lower than or equal to 100%, preferably higher than or equal to 95% to lower than or equal 99.9%. This is because, with the use of the metal oxide target with a high relative density, the dense oxide semiconductor layer can be formed.

The film formation may be performed under a rare gas atmosphere, an oxygen atmosphere, a mixed atmosphere containing a rare gas and oxygen, or the like. Moreover, it is preferably performed under an atmosphere using a high-purity gas in which impurities such as hydrogen, water, a hydroxyl group, and hydride are sufficiently removed so that entry of hydrogen, water, a hydroxyl group, and hydride into the oxide semiconductor layer can be prevented.

The oxide semiconductor layer may be subjected to plasma treatment containing oxygen. By performing plasma treatment containing oxygen on the oxide semiconductor layer, the oxygen can be contained either or both in the oxide semiconductor layer or/and in the vicinity of the interface of the oxide semiconductor layer. In that case, the amount of oxygen contained in the oxide semiconductor layer is greater than the stoichiometric proportion of the oxide semiconductor layer, preferably greater than the stoichiometric proportion and less than the double of the stoichiometric proportion. Alternatively, the amount of oxygen contained may be greater than Y, preferably greater than Y and less than 2Y, where the amount of oxygen contained in the case where a material of the oxide semiconductor layer is single crystal is Y. Still alternatively, the amount of oxygen may be greater than Z, preferably greater than Z and less than 2Z based on the amount of oxygen Z in the insulating film in the case where oxygen plasma treatment is not performed. The reason why the above preferable range has the upper limit is because the oxide semiconductor layer might absorb hydrogen, as a hydrogen absorbing alloy (a hydrogen storage alloy) does, when the amount of oxygen is too large. Note that in the oxide semiconductor layer, the amount of oxygen is larger than the amount of hydrogen.

For example, the oxide semiconductor layer can be formed as follows.

An example of the film formation conditions is as follows: the distance between the substrate and the target is 60 mm; the pressure is 0.4 Pa; the direct-current (DC) power is 0.5 kW; and the film formation atmosphere is a mixed atmosphere containing argon and oxygen (the flow rate of the oxygen is 33%). Note that a pulse DC sputtering method is preferable because powder substances (also referred to as particles or dust) generated in film formation can be reduced and the film thickness can be uniform.

First, the substrate 100 is placed in a film formation chamber kept under reduced pressure, and the substrate temperature is set to a temperature higher than or equal to 100° C. and lower than or equal to 600° C., preferably higher than or equal to 200° C. and lower than or equal to 400° C. The concentration of hydrogen (including water and a compound having a hydroxyl group) and other impurities in the oxide semiconductor layer can be reduced when film formation is performed while the substrate 100 is heated. Moreover, damage due to sputtering can be reduced. In addition, oxygen is released from the base insulating layer 102, whereby oxygen deficiency in the oxide semiconductor layer and an interface state between the base insulating layer 102 and the oxide semiconductor layer can be reduced.

Note that before the oxide semiconductor layer 106 is formed by a sputtering method, a substance attached to a surface where the oxide semiconductor layer is to be formed (e.g., a surface of the base insulating layer 102) may be removed by reverse sputtering in which a rare gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which a high-frequency voltage is applied to the surface side under an argon atmosphere so that plasma is generated near an object to be processed. Note that an atmosphere of nitrogen, helium, oxygen, or the like may be used instead of an argon atmosphere.

The oxide semiconductor layer 106 can be processed by etching after a mask having a desired shape is formed over the oxide semiconductor layer. The mask can be formed by a method such as photolithography. Alternatively, the mask may be formed by an ink-jet method or the like.

For the etching of the oxide semiconductor layer, either wet etching or dry etching may be employed. It is needless to say that both of them may be employed in combination.

After that, heat treatment (first heat treatment) is preferably performed on the oxide semiconductor layer. By the first heat treatment, hydrogen (including water and a compound having a hydroxyl group) in the oxide semiconductor layer can be removed and a structure of the oxide semiconductor layer can be ordered. The temperature of the first heat treatment is higher than or equal to 100° C. and lower than or equal to 650° C. or lower than the strain point of the substrate, preferably higher than or equal to 250° C. and lower than or equal to 600° C. The atmosphere of the first heat treatment is an oxidizing gas atmosphere or an inert gas atmosphere.

Note that an inert gas is a gas that contains nitrogen or a rare gas as its main component and, preferably, does not contain water, hydrogen, and the like. For example, the purity of nitrogen or a rare gas such as helium, neon, or argon introduced into a heat treatment apparatus is set to 6N (99.9999%) or higher, preferably 7N (99.99999%) or higher (i.e., the impurity concentration is 1 ppm or lower, preferably 0.1 ppm or lower). An inert gas atmosphere is an atmosphere that contains an inert gas as its main component and contains a reactive gas of 10 ppm or lower. The reactive gas is a gas that reacts with a semiconductor, metal, or the like.

Note that the oxidizing gas is oxygen, ozone, nitrous oxide, or the like, and it is preferable that the oxidizing gas does not contain water, hydrogen, and the like. For example, the purity of oxygen, ozone, or nitrous oxide introduced into a heat treatment apparatus is set to 6N (99.9999%) or higher, preferably 7N (99.99999%) or higher (i.e., the impurity concentration is 1 ppm or lower, preferably 0.1 ppm or lower). As the oxidizing gas atmosphere, an atmosphere in which an oxidizing gas is mixed with an inert gas may be used, and the oxidizing gas of at least 10 ppm is contained.

By the first heat treatment, oxygen is released from the base insulating layer 102, whereby the oxygen deficiency in the oxide semiconductor layer 106 and the interface state between the base insulating layer 102 and the oxide semiconductor layer 106 can be reduced. By the above reduction in the interface state, the fluctuation in the threshold voltage before and after a BT test can be reduced. Further, in general, it is known that the oxygen deficiency in the oxide semiconductor layer becomes donors and the source for generating electrons which are carriers. By the generation of electrons in the oxide semiconductor layer 106, the threshold voltage of the transistor 151 is shifted in a negative direction, so that the transistor 151 tends to be normally on. By embedding the oxygen deficiency in the oxide semiconductor layer 106, the shift of the threshold voltage in a negative direction can be suppressed.

The heat treatment can be performed in such a manner that, for example, an object to be processed is introduced into an electric furnace in which a resistance heating element or the like is used and heated at 350° C. under a nitrogen atmosphere for an hour. During the heat treatment, the oxide semiconductor layer is not exposed to the air to prevent the entry of water and hydrogen.

Note that a heat treatment apparatus is not limited to an electric furnace, and may include a device for heating an object to be processed by heat conduction or heat radiation from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high temperature gas. As the high temperature gas, used is an inert gas which does not react with an object to be processed in heat treatment, for example, nitrogen or a rare gas such as argon.

For example, as the first heat treatment, GRTA treatment may be performed as follows. The object to be processed is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object to be processed. Note that the inert gas atmosphere may be switched to an atmosphere containing an oxidizing gas during the treatment. This is because by performing the first heat treatment under an atmosphere containing the oxidizing gas, oxygen deficiency in the oxide semiconductor layer 106 can be embedded and defect levels in an energy gap due to the oxygen deficiency can be reduced.

The above heat treatment (first heat treatment) can also be referred to as dehydration treatment, dehydrogenation treatment, or the like because of its advantageous effect of removing hydrogen (including water and a compound having a hydroxyl group) and the like. In addition, the above heat treatment can also be referred to as treatment for supplying oxygen because of its advantageous effect of supplying oxygen from the insulating layer, a heat treatment atmosphere, or the like. The dehydration treatment, dehydrogenation treatment, or treatment for supplying oxygen may be performed at the timing, for example, after the oxide semiconductor layer is processed to have an island shape. Such dehydration treatment, dehydrogenation treatment, or treatment for supplying oxygen may be performed once or plural times.

Note that the case is described here where the first heat treatment is performed after the oxide semiconductor layer 106 is processed to have an island shape; however, one embodiment of the present invention is not limited thereto. The oxide semiconductor layer 106 may be processed after the first heat treatment.

Figure 3C:
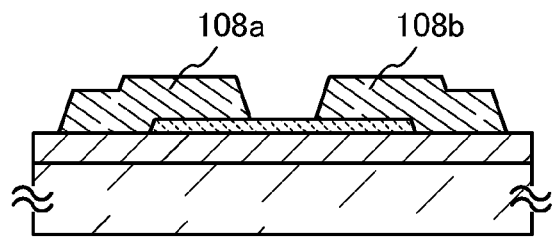

Next, a conductive layer for forming the source electrode and the drain electrode (including a wiring formed in the same layer as the source electrode and the drain electrode) is formed over the base insulating layer 102 and the oxide semiconductor layer 106 and processed to form the source electrode 108a and the drain electrode 108b (see FIG. 3C). The channel length L of the transistor depends on the minimum distance between the edges of the source electrode 108a and the drain electrode 108b which are formed here.

As the conductive layer used for the source electrode 108a and the drain electrode 108b, for example, a metal layer containing an element selected from Al, Cr, Cu, Ta, Ti, Mo, and W, or a metal nitride layer containing any of the above elements as its component (e.g., a titanium nitride layer, a molybdenum nitride layer, or a tungsten nitride layer) can be used. A high melting point metal layer of Ti, Mo, W, or the like or a metal nitride layer of any of these elements (a titanium nitride layer, a molybdenum nitride layer, or a tungsten nitride layer) may be stacked on one of or both a bottom side and a top side of a low melting point and low resistance metal layer of Al, Cu, or the like.

Alternatively, the conductive layer used for the source electrode 108a and the drain electrode 108b may be formed using a conductive metal oxide. As the conductive metal oxide, an indium oxide, a tin oxide, a zinc oxide, an indium oxide-tin oxide mixed oxide (abbreviated to ITO), an indium oxide-zinc oxide mixed oxide, or any of these metal oxide materials containing a silicon oxide can be used.

The conductive layer can be processed by etching with the use of a resist mask. Ultraviolet, KrF laser light, ArF laser light, or the like is preferably used for light exposure for forming a resist mask for the etching.

In the case where light exposure is performed so that the channel length L is less than 25 nm, the light exposure at the time of forming the resist mask is preferably performed using, for example, extreme ultraviolet having an extremely short wavelength of several nanometers to several tens of nanometers. In the light exposure using extreme ultraviolet, the resolution is high and the focus depth is large. Thus, the channel length L of the transistor formed later can be reduced, whereby the operation speed of a circuit can be increased.

Etching may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask for at least two kinds of patterns can be formed using a multi-tone mask, resulting in simplification of the process.

Note that in etching of the conductive layer, part of the oxide semiconductor layer 106 is etched, so that the oxide semiconductor layer having a groove (a recessed portion) is formed in some cases.

After that, by plasma treatment using a gas such as oxygen, ozone, or nitrous oxide, a surface of an exposed portion of the oxide semiconductor layer 106 may be oxidized and oxygen deficiency may be embedded. In the case where plasma treatment is performed, the gate insulating layer 112 which is to be in contact with part of the oxide semiconductor layer 106 is preferably formed without being exposed to the air, following the plasma treatment.

Figure 3D:
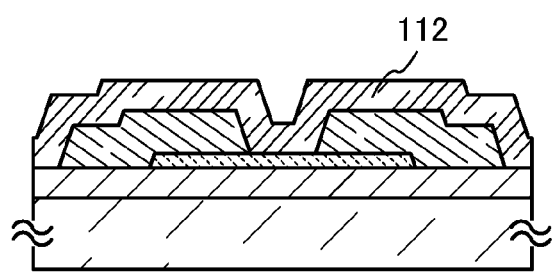

Next, the gate insulating layer 112 is formed so as to cover the source electrode 108a and the drain electrode 108b and to be in contact with part of the oxide semiconductor layer 106 (see FIG. 3D).

The gate insulating layer 112 can have a structure similar to that of the base insulating layer 102. Note that a material having a high dielectric constant, such as hafnium oxide or aluminum oxide, may be used for part of the gate insulating layer 112 in consideration of the function of the gate insulating layer of the transistor. Alternatively, a stacked layer of silicon oxide, silicon oxynitride, or silicon nitride and a material having a high dielectric constant, such as hafnium oxide or aluminum oxide, may be used in consideration of a gate withstand voltage, a condition of an interface between the oxide semiconductor layer and the gate insulating layer 112, or the like. The total thickness of the gate insulating layer 112 is preferably greater than or equal to 1 nm and less than or equal to 300 nm, more preferably greater than or equal to 5 nm and less than or equal to 50 nm. The larger the thickness of the gate insulating layer is, the more easily a short channel effect occurs; thus, the threshold voltage tends to shift to a negative direction. In addition, it is found that when the thickness of the gate insulating layer is less than or equal to 5 nm, leakage due to a tunnel current is increased. At least any one of the insulating layers in contact with the oxide semiconductor layer, which include the gate insulating layer 112, contains a silicon peroxide radical.

Second heat treatment is preferably performed after the gate insulating layer 112 is formed. The second heat treatment is performed at a temperature of higher than or equal to 250° C. and lower than or equal to 700° C., preferably higher than or equal to 350° C. and lower than or equal to 600° C. or lower than the strain point of the substrate.

The second heat treatment may be performed under an atmosphere of an oxidizing gas or an inert gas. Note that it is preferable that water, hydrogen, and the like be not contained in the atmosphere of oxidizing gas or an inert gas. Further, the purity of the gas introduced into a heat treatment apparatus is preferably set to 6N (99.9999%) or higher, more preferably 7N (99.99999%) or higher (that is, the impurity concentration is 1 ppm or lower, preferably 0.1 ppm or lower).

The second heat treatment is performed while the oxide semiconductor layer 106 and the gate insulating layer 112 are in contact with each other. Thus, oxygen which is one of main components of the oxide semiconductor can be supplied from the gate insulating layer 112 containing a silicon peroxide radical to the oxide semiconductor layer 106. Accordingly, oxygen deficiency in the oxide semiconductor layer 106 and an interface state between the oxide semiconductor layer and the gate insulating layer 112 can be reduced. At the same time, deficiency in the gate insulating layer 112 can also be reduced.

Note that there is no particular limitation on the timing of the second heat treatment as long as it is after the gate insulating layer 112 is formed. For example, the second heat treatment may be performed after the gate electrode 114 is formed.

Figure 3E:
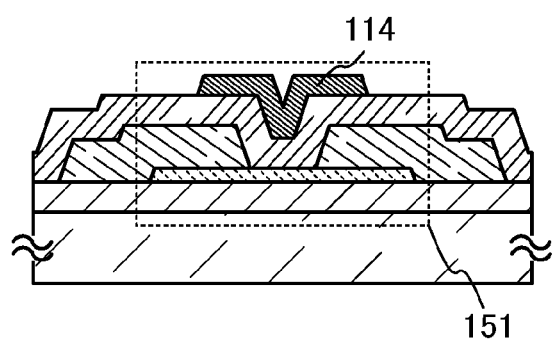

Then, the gate electrode 114 is formed (see FIG. 3E). The gate electrode 114 can be formed using a metal material such as molybdenum, titanium, tantalum, tungsten, aluminum, copper, neodymium, or scandium, nitride of any of these metal materials, or an alloy material which contains any of these metal materials as its main component. Note that the gate electrode 114 may have a single-layer structure or a stacked-layer structure.

Through the above process, the transistor 151 is formed.

Next, an example of a manufacturing process of the transistor 152 in FIG. 2A will be described with reference to FIGS. 4A to 4E.

Figure 4A:
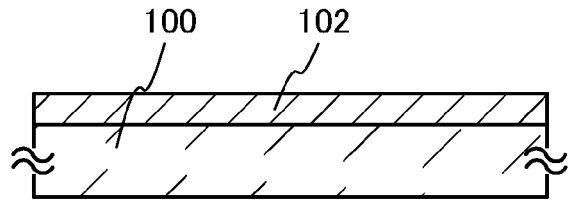
FIGS. 4A to 4E are cross-sectional views showing an example of a manufacturing process of a semiconductor device which is one embodiment of the present invention.

First, a base insulating layer 102 is formed over a substrate 100 (see FIG. 4A). At least any one of the insulating layers in contact with the oxide semiconductor layer, which include the base insulating layer 102, contains a silicon peroxide radical.

Figure 4B:
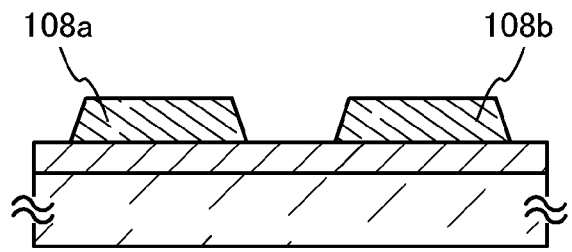

Next, a conductive layer for forming the source electrode and the drain electrode (including a wiring formed in the same layer as the source electrode and the drain electrode) is formed over the base insulating layer 102 and processed to form a source electrode 108a and a drain electrode 108b (see FIG. 4B). After that, second heat treatment similar to that performed on the transistor 151 may be performed.

Figure 4C:
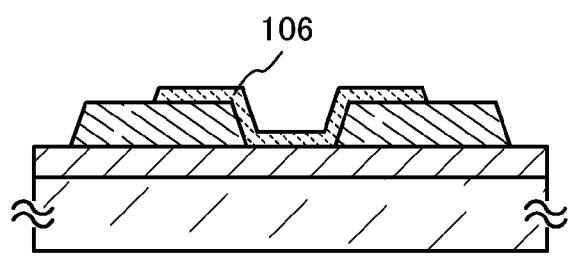

Next, an oxide semiconductor layer is formed over the base insulating layer 102 so as to be connected to the source electrode 108a and the drain electrode 108b and processed to form an oxide semiconductor layer 106 having an island shape (see FIG. 4C). After that, first heat treatment similar to that performed on the transistor 151 may be performed.

Figure 4D:
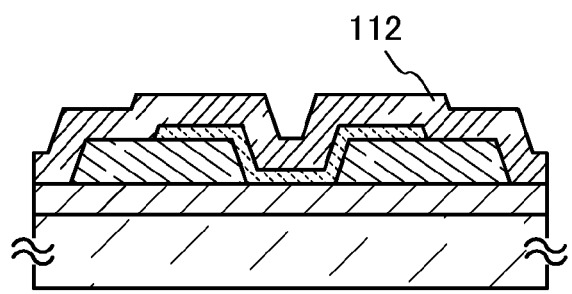

Next, a gate insulating layer 112 is formed so as to be in contact with the oxide semiconductor layer 106 and part of the source electrode 108a and the drain electrode 108b and cover the source electrode 108a, the drain electrode 108b, and the oxide semiconductor layer 106 (see FIG. 4D). At least any one of the insulating layers in contact with the oxide semiconductor layer, which include the gate insulating layer 112, contains a silicon peroxide radical. After that, second heat treatment similar to that performed on the transistor 151 may be performed.

Figure 4E:
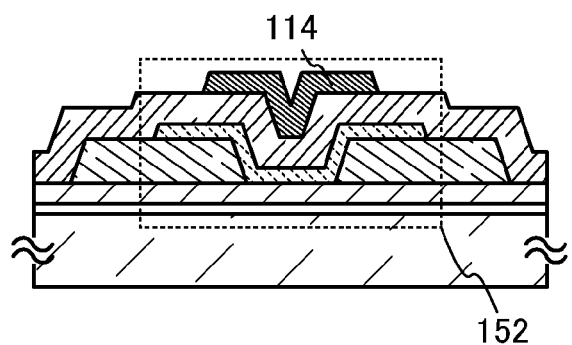

Then, a gate electrode 114 is formed (see FIG. 4E).

Through the above process, the transistor 152 is formed.

When a charge is trapped at the surface of the oxide semiconductor layer, the threshold voltage of the transistor is shifted. For example, when a positive charge is trapped on the back channel side, the threshold voltage of the transistor is shifted in a negative direction. However, as one of factors of such charge trapping, the model where cations (or atoms which are sources of the cations) travel and are trapped can be supposed. In one embodiment of the present invention, the interface states between the oxide semiconductor layer and the base insulating layer 102 and between the oxide semiconductor layer and the gate insulating layer 112 are reduced by the base insulating layer 102 and the gate insulating layer 112 which each contain a silicon peroxide radical, so that it is possible to reduce charge trapping which may be caused in the above model; therefore, the shift of the threshold voltage of the transistor can be suppressed.

Next, an example of a manufacturing process of the transistor 153 in FIG. 2B will be described with reference to FIGS. 5A to 5E.

Figure 5A:
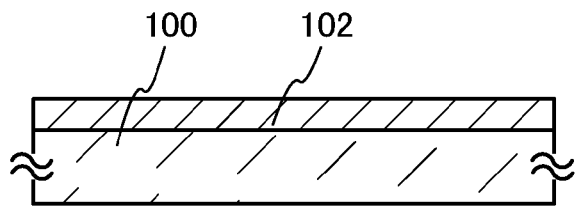
FIGS. 5A to 5E are cross-sectional views showing an example of a manufacturing process of a semiconductor device which is one embodiment of the present invention.

First, a base insulating layer 102 is formed over a substrate 100 (see FIG. 5A).

Figure 5B:
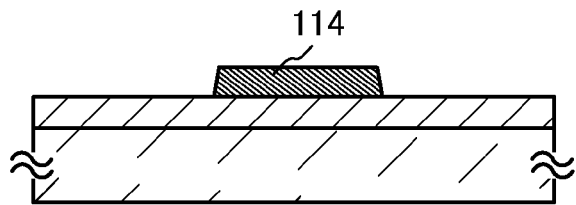
Figure 5C:
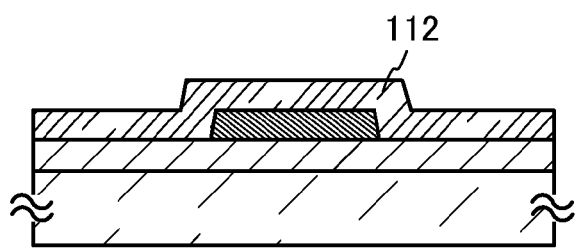

Next, a gate electrode 114 is formed over the base insulating layer 102 (see FIG. 5B).

Next, a gate insulating layer 112 is formed over the gate electrode 114. At least any one of the insulating layers in contact with the oxide semiconductor layer, which include the gate insulating layer 112, contains a silicon peroxide radical (see FIG. 5C).

Figure 5D:
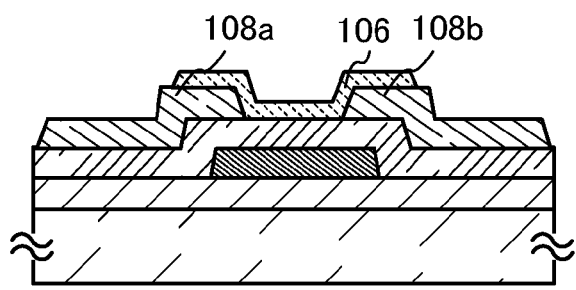

Next, a source electrode 108a and a drain electrode 108b are formed over the gate insulating layer 112, an oxide semiconductor layer is formed so as to be connected to the source electrode 108a and the drain electrode 108b, and the oxide semiconductor layer is processed to form an oxide semiconductor layer 106 having an island shape (see FIG. 5D). After that, first heat treatment similar to that performed on the transistor 151 may be performed. After that, second heat treatment similar to that performed on the transistor 151 may be performed.

Figure 5E:
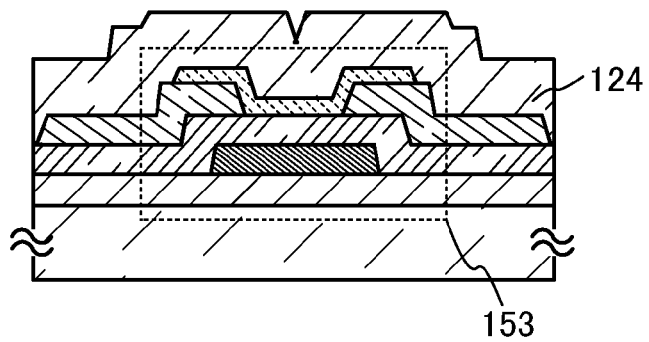

Next, a protective insulating layer 124 is formed so as to cover the oxide semiconductor layer 106, the source electrode 108a, and the drain electrode 108b (see FIG. 5E). At least any one of the insulating layers in contact with the oxide semiconductor layer, which include the protective insulating layer 124, contains a silicon peroxide radical.

Through the above process, the transistor 153 is formed.

Next, an example of a manufacturing process of the transistor 154 in FIG. 2C will be described with reference to FIGS. 6A to 6E.

Figure 6A:
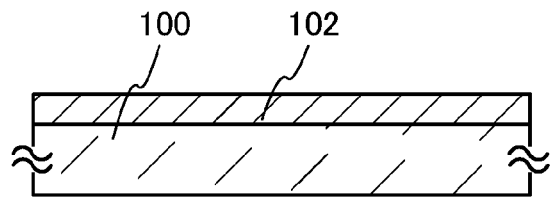
FIGS. 6A to 6E are cross-sectional views showing an example of a manufacturing process of a semiconductor device which is one embodiment of the present invention.

First, a base insulating layer 102 is formed over a substrate 100 (see FIG. 6A).

Figure 6B:
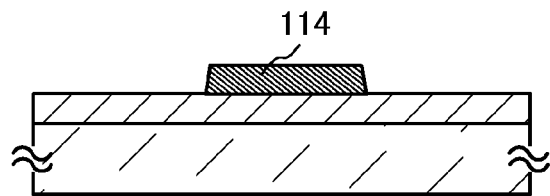

Next, a gate electrode 114 is formed over the base insulating layer 102 (see FIG. 6B).

Figure 6C:
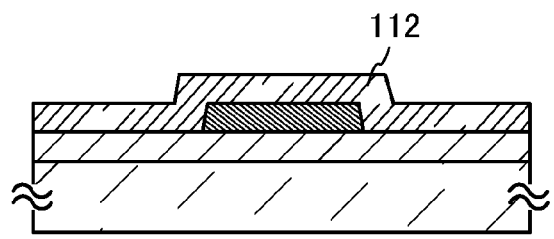
Figure 6D:
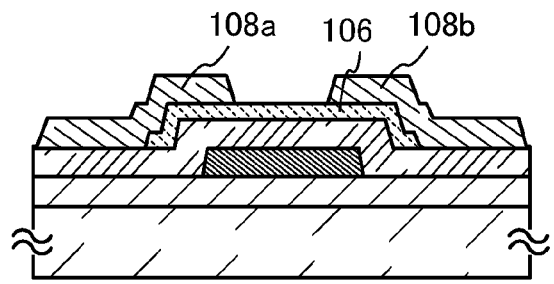

Next, a gate insulating layer 112 is formed over the gate electrode 114 (see FIG. 6C). At least any one of the insulating layers in contact with the oxide semiconductor layer, which include the gate insulating layer 112, contains a silicon peroxide radical.

Next, an oxide semiconductor layer is formed over the gate insulating layer 112 and processed to form an oxide semiconductor layer 106 having an island shape. After that, first heat treatment similar to that performed on the transistor 151 may be performed. Then, a source electrode 108a and a drain electrode 108b are connected to the oxide semiconductor layer 106 (see FIG. 6D).

Figure 6E:
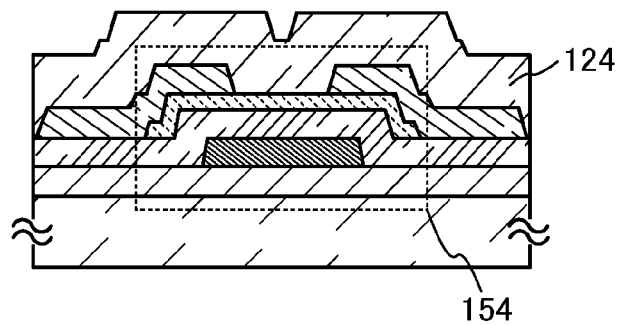

Next, a protective insulating layer 124 is formed so as to cover the oxide semiconductor layer 106, the source electrode 108a, and the drain electrode 108b (see FIG. 6E). At least any one of the insulating layers in contact with the oxide semiconductor layer, which include the protective insulating layer 124, contains a silicon peroxide radical.

Through the above process, the transistor 154 is formed.

Next, an example of a manufacturing process of the transistor 155 in FIG. 2D will be described with reference to FIGS. 7A to 7E.

Figure 7A:
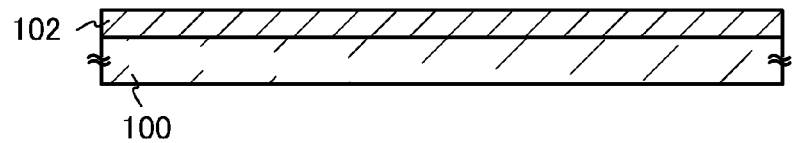
FIGS. 7A to 7E are cross-sectional views showing an example of a manufacturing process of a semiconductor device which is one embodiment of the present invention.

First, a base insulating layer 102 is formed over a substrate 100 (see FIG. 7A). At least any one of the insulating layers in contact with the oxide semiconductor layer, which include the base insulating layer 102, contains a silicon peroxide radical.

Figure 7B:
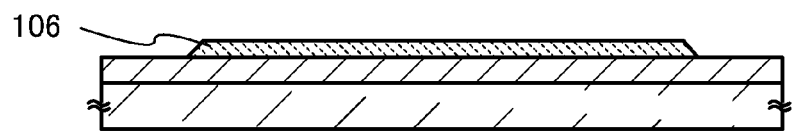

Next, an oxide semiconductor layer is formed over the base insulating layer 102 and processed to form an oxide semiconductor layer 106 having an island shape (see FIG. 7B). After that, first heat treatment similar to that performed on the transistor 151 may be performed.

Figure 7C:
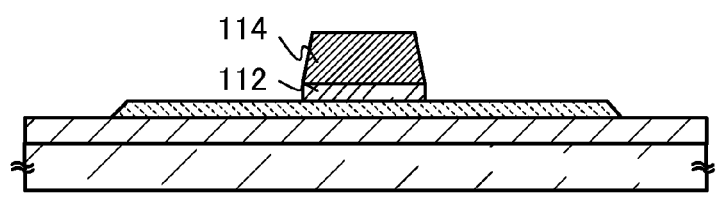
Figure 7D:
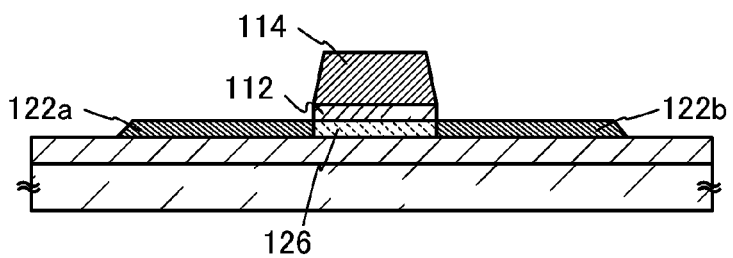
Figure 7E:
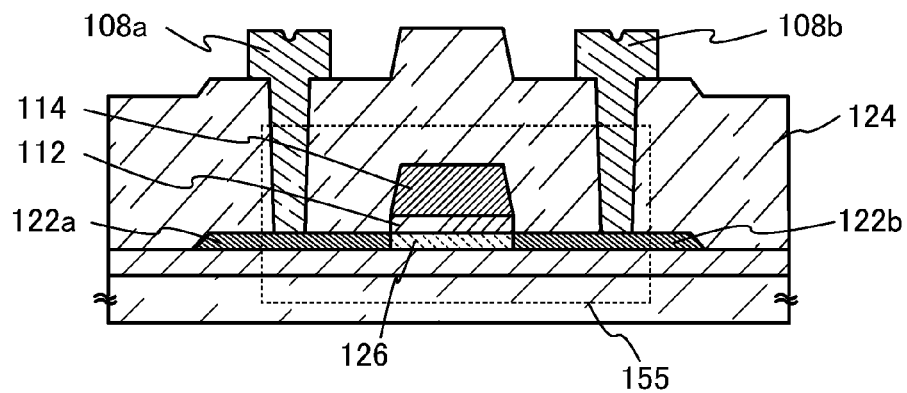

Next, a gate insulating layer 112 and a gate electrode 114 are formed and processed to have similar patterns by photolithography (see FIG. 7C). At this time, after the process of the gate electrode 114, the gate insulating layer 112 may be processed using the gate electrode 114 as a mask.

Next, the resistance of the oxide semiconductor layer 106 is reduced using the gate electrode 114 as a mask, so that a source region 122a and a drain region 122b are formed. A region under the gate electrode where the resistance is not reduced becomes a channel region 126 (see FIG. 7D). At this time, a channel length L of the transistor is determined by the width of the gate electrode. By patterning using the gate electrode as the mask in such a manner, the source region and the drain region do not overlap with the gate electrode and parasitic capacitance is not generated; therefore, the operation speed of the transistor can be increased.

Next, a protective insulating layer 124 is formed and openings are provided in regions of the protective insulating layer 124, which overlap with the source region 122a and the drain region 122b. A conductive layer for forming the source electrode and the drain electrode (including a wiring formed in the same layer as the source and drain electrodes) is formed and processed to form a source electrode 108a and a drain electrode 108b (see FIG. 7E).

Through the above process, the transistor 155 is formed.

The oxide semiconductor layer used as the active layer of the transistor described in this embodiment is an oxide semiconductor layer highly purified to be i-type (intrinsic), through substrate heating in formation of an oxide semiconductor layer or heat treatment after formation of the oxide semiconductor layer, in which impurities such as hydrogen (including water and a compound having a hydroxyl group) are removed from the oxide semiconductor and oxygen which is one of main components of the oxide semiconductor and is simultaneously reduced in a step of removing impurities is supplied to the oxide semiconductor layer from an insulating layer containing a silicon peroxide radical. The transistor including the oxide semiconductor film which is highly purified in such a manner has a small off-state current, suppressed variation in the electrical characteristics, and electric stability.

Thus, a semiconductor device including an oxide semiconductor and having stable electric characteristics can be provided. Therefore, a semiconductor device with high reliability can be provided.

The structures, the methods, and the like described in this embodiment can be combined as appropriate with any of the structures, the methods, and the like described in the other embodiments.

[Embodiment 2]

A semiconductor device (also referred to as a display device) with a display function can be manufactured using the transistor, an example of which is shown in Embodiment 1. Some or all driver circuits including the transistors can be formed over a substrate where a pixel portion is formed, whereby a system-on-panel can be obtained.

Figure 8A:
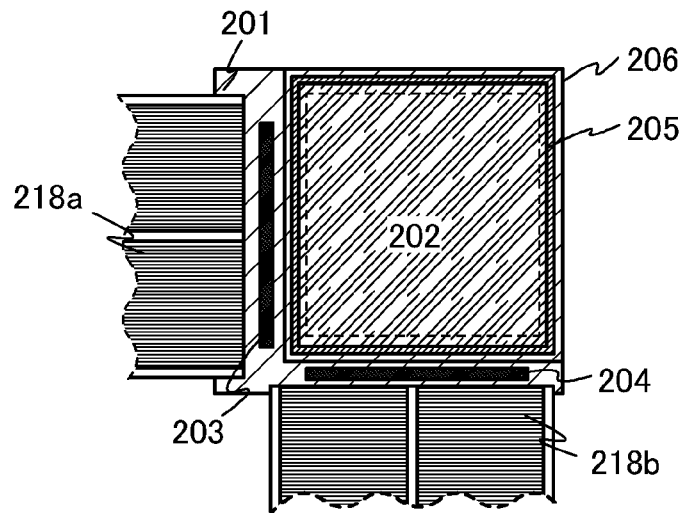
FIGS. 8A to 8C each show one mode of a semiconductor device which is one embodiment of the present invention.

In FIG. 8A, a sealant 205 is provided to surround a pixel portion 202 provided over a first substrate 201, and the pixel portion 202 is sealed with the sealant 205 between the first substrate 201 and a second substrate 206. In FIG. 8A, a scan line driver circuit 204 and a signal line driver circuit 203 each are formed using a single crystal semiconductor layer or a polycrystalline semiconductor layer over a substrate prepared separately, and mounted in a region different from the region surrounded by the sealant 205 over the first substrate 201. Various signals and potentials are supplied to the signal line driver circuit 203 and the scan line driver circuit 204, each of which is separately formed, and the pixel portion 202, from flexible printed circuits (FPCs) 218a and 218b.

Figure 8B:
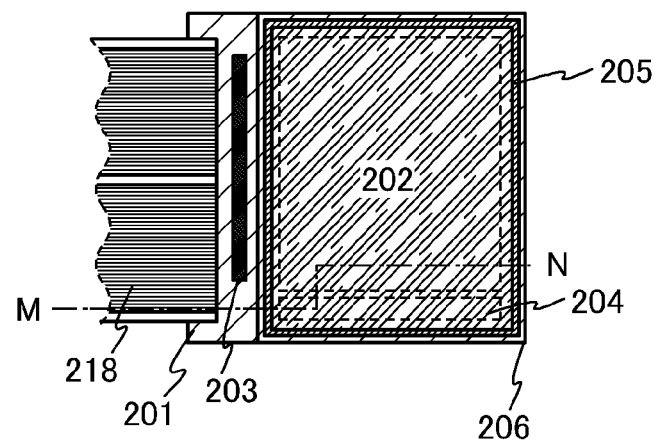
Figure 8C:
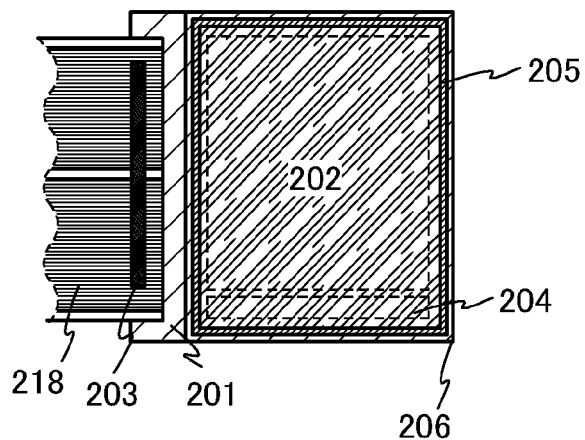

In FIGS. 8B and 8C, the sealant 205 is provided to surround the pixel portion 202 and the scan line driver circuit 204 which are provided over the first substrate 201. The second substrate 206 is provided over the pixel portion 202 and the scan line driver circuit 204. Thus, the pixel portion 202 and the scan line driver circuit 204 are sealed together with a display element, by the first substrate 201, the sealant 205, and the second substrate 206. In FIGS. 8B and 8C, the signal line driver circuit 203 is formed using a single crystal semiconductor layer or a polycrystalline semiconductor layer over a substrate prepared separately, and mounted in a region different from the region surrounded by the sealant 205 over the first substrate 201. In FIGS. 8B and 8C, various signals and potentials are supplied to the signal line driver circuit 203 which is separately formed, the scan line driver circuit 204, and the pixel portion 202, from an FPC 218.

Although FIGS. 8B and 8C each show the example in which the signal line driver circuit 203 is formed separately and mounted on the first substrate 201, one embodiment of the present invention is not limited to this structure. The scan line driver circuit may be separately formed and then mounted, or only part of the signal line driver circuit or part of the scan line driver circuit may be separately formed and then mounted.

Note that a method for connecting a separately formed driver circuit is not particularly limited, and a chip on glass (COG) method, a wire bonding method, a tape automated bonding (TAB) method, or the like can be used. FIG. 8A shows an example in which the signal line driver circuit 203 and the scan line driver circuit 204 are mounted by a COG method. FIG. 8B shows an example in which the signal line driver circuit 203 is mounted by a COG method. FIG. 8C shows an example in which the signal line driver circuit 203 is mounted by a TAB method.

The display device includes in its category a panel in which a display element is sealed and a module in which an IC such as a controller is mounted on the panel.

Note that a display device in this specification means an image display device, a display device, or a light source (including a lighting device). The display device also includes the following modules in its category: a module to which a connector such as an FPC, a TAB tape, or a tape carrier package (TCP) is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and any of transistors which are described in Embodiment 1 as the examples can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can also be used.

Figure 9:
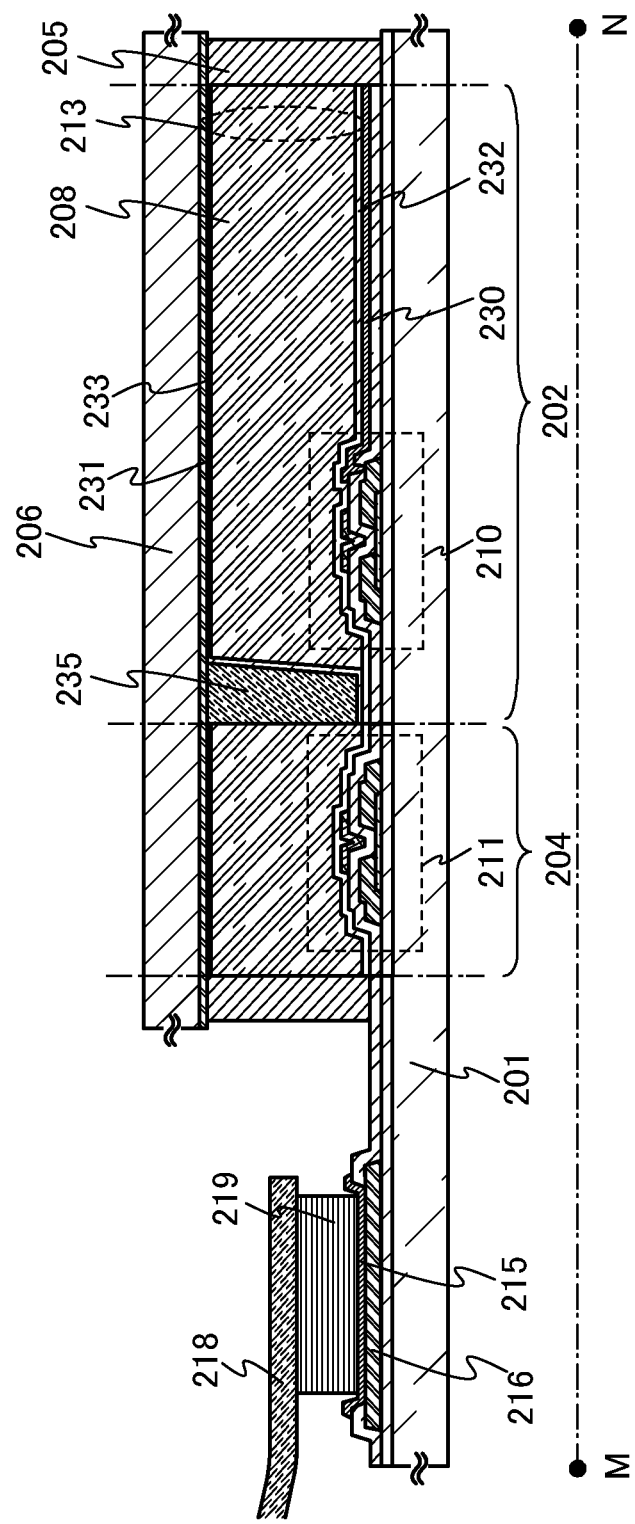
FIG. 9 is a cross-sectional view showing one mode of a semiconductor device which is one embodiment of the present invention.
Figure 10:
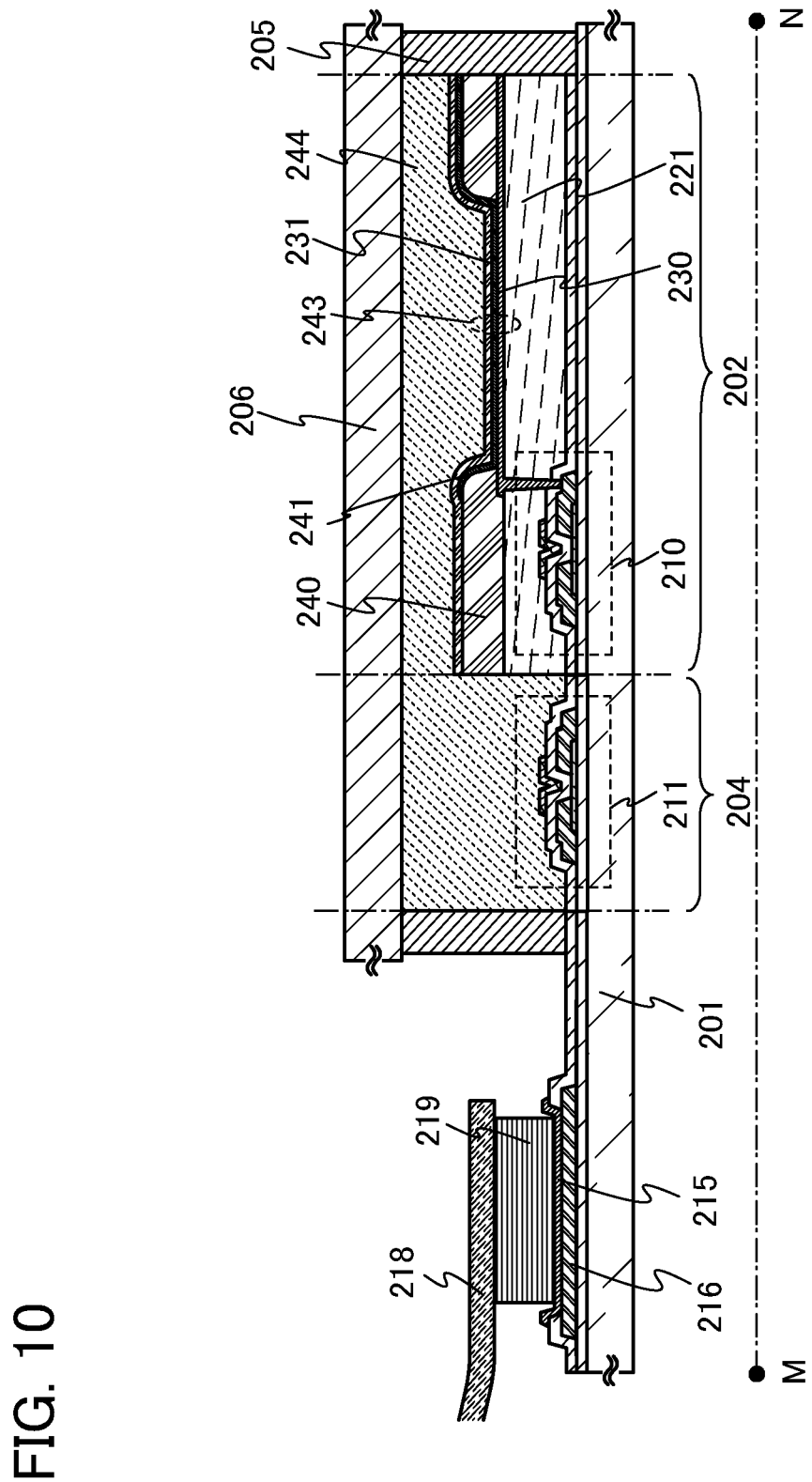
FIG. 10 is a cross-sectional view showing one mode of a semiconductor device which is one embodiment of the present invention.
Figure 11:
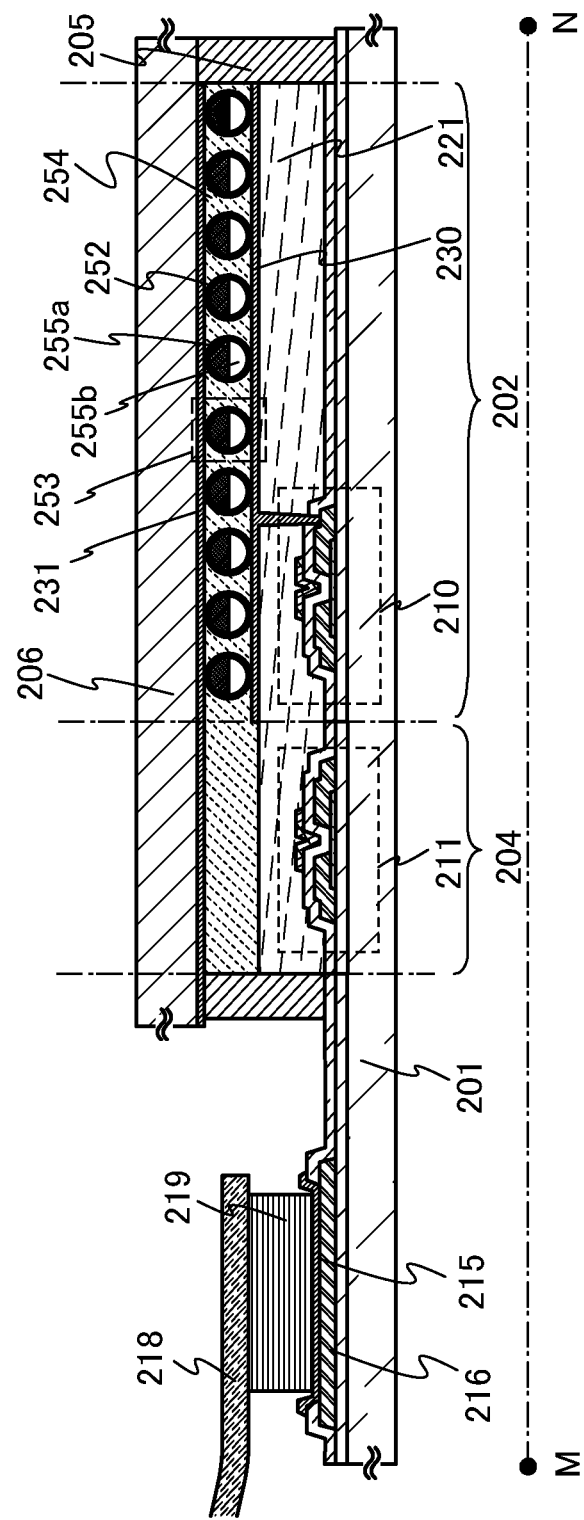
FIG. 11 is a cross-sectional view showing one mode of a semiconductor device which is one embodiment of the present invention.

One embodiment of the semiconductor device is described with reference to FIG. 9, FIG. 10, and FIG. 11. FIG. 9, FIG. 10, and FIG. 11 correspond to cross-sectional views taken along line M-N in FIG. 8B.

As illustrated in FIG. 9, FIG. 10, and FIG. 11, the semiconductor device includes a connection terminal electrode 215 and a terminal electrode 216. The connection terminal electrode 215 and the terminal electrode 216 are electrically connected to a terminal included in the FPC 218 through an anisotropic conductive layer 219.

The connection terminal electrode 215 is formed of the same conductive layer as a first electrode layer 230. The terminal electrode 216 is formed of the same conductive layer as a source electrode and a drain electrode of a transistor 210 and a transistor 211.

Each of the pixel portion 202 and the scan line driver circuit 204 provided over the first substrate 201 includes a plurality of transistors. In FIG. 9, FIG. 10, and FIG. 11, the transistor 210 included in the pixel portion 202 and the transistor 211 included in the scan line driver circuit 204 are illustrated as an example.

In this embodiment, any of the transistors described in Embodiment 1 can be applied to the transistors 210 and 211. Fluctuation in the electric characteristics of the transistors 210 and 211 is suppressed and the transistors 210 and 211 are electrically stable. As described above, a semiconductor device with high reliability can be provided as the semiconductor devices in this embodiment in FIG. 9, FIG. 10, and FIG. 11.

The transistor 210 provided in the pixel portion 202 is electrically connected to the display element to form a display panel. A variety of display elements can be used as the display element as long as display can be performed.

FIG. 9 shows an example of a liquid crystal display device using a liquid crystal element as a display element. In FIG. 9, a liquid crystal element 213 is a display element including the first electrode layer 230, a second electrode layer 231, and a liquid crystal layer 208. Note that insulating layers 232 and 233 serving as alignment layers are provided so that the liquid crystal layer 208 is interposed therebetween. The second electrode layer 231 is formed on the second substrate 206 side. The first electrode layer 230 and the second electrode layer 231 are stacked with the liquid crystal layer 208 interposed therebetween.

A spacer 235 is a columnar spacer obtained by selective etching of an insulating layer and is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be improved.

The specific resistivity of the liquid crystal material is $1 \times 10^9$ Ω·cm or more, preferably $1 \times 10^{11}$ Ω·cm or more, or more preferably $1 \times 10^{12}$ Ω·cm or more. Note that the specific resistivity in this specification is measured at 20° C.

The size of a storage capacitor provided in the liquid crystal display device is set in consideration of the leakage current of the transistor provided in the pixel portion or the like so that a charge can be held for a predetermined period. Since the transistor including a highly purified oxide semiconductor layer is used, a storage capacitor having capacitance which is ⅓ or less, preferably ⅕ or less with respect to a liquid crystal capacitance of each pixel is sufficient to be provided.

In the transistor used in this embodiment, which includes a highly purified oxide semiconductor layer, the current in an off state (an off-state current) can be made small. Therefore, an electrical signal such as an image signal can be held for a long period, and a writing interval can be set long. Accordingly, frequency of refresh operation can be reduced, which leads to an advantageous effect of suppressing power consumption.

The field-effect mobility of the transistor including a highly purified oxide semiconductor layer used in this embodiment can be relatively high, whereby high-speed operation is possible. Thus, by using the transistor in a pixel portion of the liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is one of methods of controlling alignment of liquid crystal molecules of a liquid crystal display panel. The vertical alignment mode is a mode in which liquid crystal molecules are aligned vertically to a panel surface when a voltage is not applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in their respective regions.

In the display device, a black matrix (a light-blocking layer); an optical member (an optical substrate) such as a polarizing member, a retardation member, or an anti-reflection member; and the like are provided as appropriate. For example, circular polarization may be employed by using a polarizing substrate and a retardation substrate. In addition, a backlight, a side light, or the like may be used as a light source.

In addition, with the use of a plurality of light-emitting diodes (LEDs) as a backlight, a time-division display method (a field-sequential driving method) can be employed. With the field-sequential driving method, color display can be performed without using a color filter.

As a display method in the pixel portion, a progressive method, an interlace method, or the like can be employed. Color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. The sizes of display regions may be different between respective dots of color elements. Note that the present invention is not limited to the application to a display device for color display but can also be applied to a display device for monochrome display.

Alternatively, as the display element included in the display device, a light-emitting element utilizing EL can be used. Light-emitting elements utilizing EL are categorized by whether a light-emitting material is an organic compound or an inorganic compound, and in general, the former is called an organic EL element and the latter is called an inorganic EL element.

In an organic EL element, by application of a voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element is described here as a light-emitting element.

In order to extract light emitted from the light-emitting element, at least one of a pair of electrodes may be transparent. Then, a transistor and a light-emitting element are formed over a substrate. The light-emitting element can have any of the following structure: a top emission structure in which light is extracted from one surface side of the substrate where the transistor and the light-emitting element are provided; a bottom emission structure in which light is extracted from one surface side of the substrate where the transistor and the light-emitting element are not provided; or a dual emission structure in which light is extracted from one surface side of the substrate where the transistor and the light-emitting element are provided and another surface side of the substrate where the transistor and the light-emitting element are not provided.

FIG. 10 shows an example of a light-emitting device using a light-emitting element as a display element. A light-emitting element 243 which is a display element is electrically connected to the transistor 210 provided in the pixel portion 202. The structure of the light-emitting element 243 is not limited to the stacked-layer structure including the first electrode layer 230, an electroluminescent layer 241, and the second electrode layer 231, which is illustrated in FIG. 10. The structure of the light-emitting element 243 can be changed as appropriate depending on a direction in which light is extracted from the light-emitting element 243, or the like.

A partition wall 240 can be formed using an organic insulating material or an inorganic insulating material. It is particularly preferable that the partition wall 240 be formed using a photosensitive resin material to have an opening over the first electrode layer 230 so that a sidewall of the opening is formed as a tilted surface with continuous curvature.

The electroluminescent layer 241 may be formed with either a single layer or a stacked layer of a plurality of layers.

A protective layer may be formed over the second electrode layer 231 and the partition wall 240 in order to prevent entry of oxygen, hydrogen, moisture, carbon dioxide, or the like into the light-emitting element 243. As the protective layer, a silicon nitride layer, a silicon nitride oxide layer, a diamond-like carbon (DLC) layer, an aluminum oxide layer, an aluminum nitride layer, or the like can be formed. In a space sealed with the first substrate 201, the second substrate 206, and the sealant 205, a filler 244 is provided and tightly sealed. In such a manner, it is preferable that the light-emitting element be packaged (sealed) with a protective film (such as a laminate film or an ultraviolet curable resin film) or a cover material with high air-tightness and little degasification so that the light-emitting element is not exposed to the outside air.

As the filler 244, an ultraviolet curable resin or a thermosetting resin can be used in addition to an inert gas such as nitrogen or argon, and polyvinyl chloride (PVC), an acrylic resin, a polyimide resin, an epoxy resin, a silicone resin, polyvinyl butyral (PVB), ethylene vinyl acetate (EVA), or the like can be used. For example, nitrogen may be used for the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection layer. For example, anti-glare treatment by which reflected light can be diffused by projections and depressions on the surface so as to reduce the glare can be performed.

Further, an electronic paper in which electronic ink is driven can be provided as the display device. The electronic paper is also called an electrophoretic display device (an electrophoretic display) and is advantageous in that it has the same level of readability as regular paper, it has less power consumption than other display devices, and it can be made thin and light.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless) from each other.

Thus, an electrophoretic display device is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material thereof.

As the electronic paper, a display device using a twisting ball display method can be used. The twisting ball display method refers to a method in which spherical particles each colored in white and black are arranged between a first electrode layer and a second electrode layer which are electrode layers used for a display element, and a potential difference is generated between the first electrode layer and the second electrode layer to control orientation of the spherical particles, so that display is performed.

FIG. 11 illustrates an active matrix electronic paper as one embodiment of a semiconductor device. The electronic paper in FIG. 11 is an example of a display device using a twisting ball display method.

Between the first electrode layer 230 connected to the transistor 210 and the second electrode layer 231 provided on the second substrate 206, spherical particles 253 each of which includes a black region 255a, a white region 255b, and a cavity 252 around the regions which is filled with liquid, are provided. A space around the spherical particles 253 is filled with a filler 254 such as a resin. The second electrode layer 231 corresponds to a common electrode (counter electrode). The second electrode layer 231 is electrically connected to a common potential line.

Note that in FIG. 9, FIG. 10, and FIG. 11, a flexible substrate as well as a glass substrate can be used as the first substrate 201 and the second substrate 206. For example, a plastic substrate having light-transmitting properties can be used. For plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can also be used.

An insulating layer 221 can be formed using an organic insulating material or an inorganic insulating material. Note that an organic insulating material having heat resistance, such as an acrylic resin, a polyimide resin, a benzocyclobutene resin, a polyamide resin, or an epoxy resin is preferably used as a planarizing insulating layer. Other than such organic insulating materials, it is possible to use a low-dielectric constant material (a low-k material), a siloxane-based resin, phosphosilicate glass (PSG), borophosphosilicate glass (BPSG), or the like. The insulating layer 221 may be formed by stacking a plurality of insulating layers formed of these materials.

There is no particular limitation on the method for forming the insulating layer 221, and the insulating layer 221 can be formed, depending on a material thereof, by a sputtering method, a spin coating method, a dipping method, a spray coating method, a droplet discharging method (e.g., an ink-jet method, screen printing, or offset printing), roll coating, curtain coating, knife coating, or the like.

The display device performs display by transmitting light from a light source or a display element. Thus, the substrates and the thin films such as insulating layers and conductive layers provided in the pixel portion where light is transmitted have light-transmitting properties with respect to light in the visible-light wavelength range.

The first electrode layer 230 and the second electrode layer 231 (each of which are also referred to as a pixel electrode layer, a common electrode layer, a counter electrode layer, or the like) for applying a voltage to the display element may have light-transmitting properties or light-reflecting properties, which depends on the direction in which light is extracted, the position where the electrode layer is provided, and the pattern structure of the electrode layer.

The first electrode layer 230 and the second electrode layer 231 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 230 and the second electrode layer 231 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode layer 230 and the second electrode layer 231. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken due to static electricity or the like, a protective circuit for protecting the driver circuit is preferably provided. The protective circuit is preferably formed using a nonlinear element.

As described above, by using any of the transistors, the examples of which are shown in Embodiment 1, a semiconductor device with high reliability can be provided. Note that the transistors, the examples of which are shown in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The structures, the methods, and the like described in this embodiment can be combined as appropriate with any of the structures, the methods, and the like described in the other embodiments.

[Embodiment 3]

A semiconductor device which is one embodiment of the present invention can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine. Examples of electronic devices each including the semiconductor device described in the above embodiment are described.

Figure 12A:
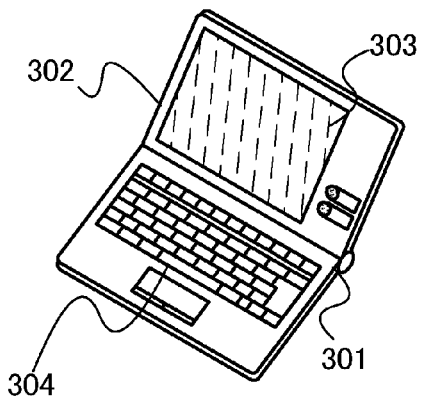
FIGS. 12A to 12F each illustrate an electronic device as a semiconductor device which is one embodiment of the present invention.

FIG. 12A illustrates a laptop personal computer, which includes a main body 301, a housing 302, a display portion 303, a keyboard 304, and the like. By applying the semiconductor device described in Embodiment 1 or 2, the laptop personal computer can have high reliability.

Figure 12B:
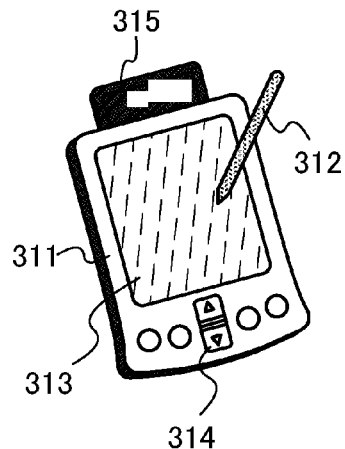

FIG. 12B illustrates a portable information terminal (PDA), which includes a display portion 313, an external interface 315, an operation button 314, and the like in a main body 311. A stylus 312 is included as an accessory for operation. By applying the semiconductor device described in Embodiment 1 or 2, the portable information terminal (PDA) with higher reliability can be provided.

Figure 12C:
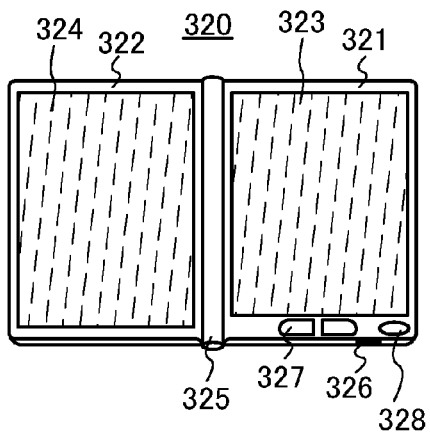

FIG. 12C shows an example of an e-book reader. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322, respectively. The display portion 323 and the display portion 324 may display one image or different images. When the display portion 323 and the display portion 324 display different images, for example, text can be displayed on a display portion on the right side (the display portion 323 in FIG. 12C) and images can be displayed on a display portion on the left side (the display portion 324 in FIG. 12C). By applying the semiconductor device described in Embodiment 1 or 2, the e-book reader 320 can have high reliability.

FIG. 12C shows an example in which the housing 321 is provided with an operation portion and the like. For example, the housing 321 is provided with a power switch 326, operation keys 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 320 may have a function of an electronic dictionary.

The e-book reader 320 may send and receive information wirelessly. Through wireless communication, desired book data or the like can be purchased and downloaded from an e-book server.

Figure 12D:
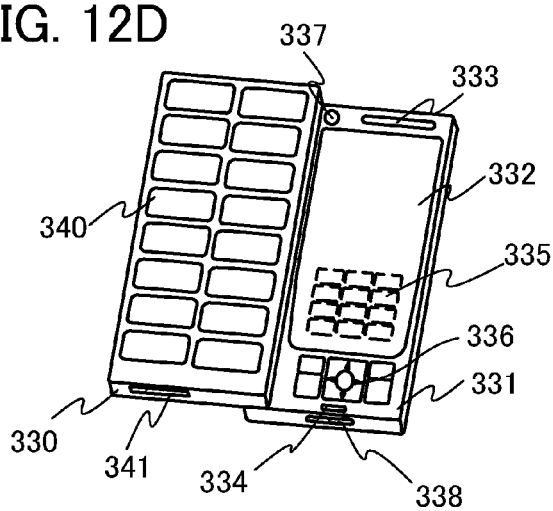

FIG. 12D illustrates a mobile phone, which includes two housings, a housing 330 and a housing 331. The housing 331 includes a display panel 332, a speaker 333, a microphone 334, a pointing device 336, a camera lens 337, an external connection terminal 338, and the like. In addition, the housing 330 includes a solar cell 340 having a function of charge of the portable information terminal, an external memory slot 341, and the like. Further, an antenna is incorporated in the housing 331. By applying the semiconductor device described in Embodiment 1 or 2, the mobile phone can have high reliability.

Further, the display panel 332 is provided with a touch panel. A plurality of operation keys 335 which are displayed as images is illustrated by dashed lines in FIG. 12D. Note that the mobile phone includes a boosting circuit for raising a voltage output from the solar cell 340 to a voltage necessary for each circuit.

In the display panel 332, the display direction can be changed as appropriate depending on a usage pattern. Further, the mobile phone is provided with the camera lens 337 on the same surface as the display panel 332, and thus it can be used as a video phone. The speaker 333 and the microphone 334 can be used for videophone calls, recording and playing sound, and the like as well as voice calls. Moreover, the housings 330 and 331 in a state where they are opened as illustrated in FIG. 12D can be slid so that one overlaps the other; therefore, the size of the mobile phone can be reduced, which makes the mobile phone suitable for being carried.

The external connection terminal 338 can be connected to an AC adapter and various types of cables such as a USB cable, and charging and data communication with a personal computer are possible. Moreover, a larger amount of data can be stored by inserting a recording medium to the external memory slot 341 and can be moved.

Further, in addition to the above functions, an infrared communication function, a television reception function, or the like may be provided.

Figure 12E:
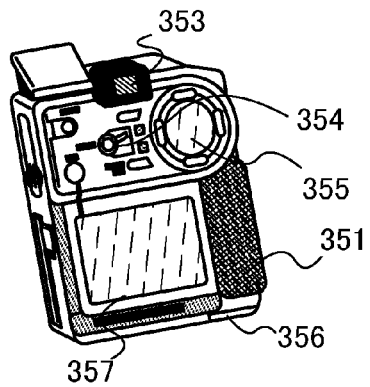

FIG. 12E illustrates a digital video camera, which includes a main body 351, a display portion (A) 357, an eyepiece 353, an operation switch 354, a display portion (B) 355, a battery 356, and the like. By applying the semiconductor device described in Embodiment 1 or 2, the digital video camera can have high reliability.

Figure 12F:
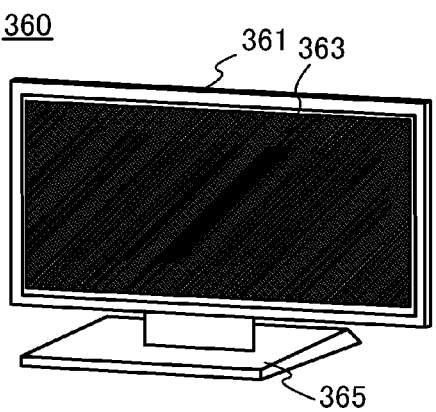

FIG. 12F shows an example of a television set. In a television set 360, a display portion 363 is incorporated in a housing 361. The display portion 363 can display images. Here, the housing 361 is supported by a stand 365. By applying the semiconductor device described in Embodiment 1 or 2, the television set 360 can have high reliability.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. With the use of the receiver, general television broadcasting can be received. Furthermore, when the display device is connected to a communication network with or without wires via the modem, one-way (from a sender to a receiver) or two-way (between a sender and a receiver or between receivers) information communication can be performed.

The structures, the methods, and the like described in this embodiment can be combined as appropriate with any of the structures, the methods, and the like described in the other embodiments.

EXAMPLE 1

In this example, an insulating layer containing a silicon peroxide radical, which is provided in the semiconductor device according to one embodiment of the present invention, is analyzed by an ESR method, and analysis results thereof is described.

In this example, a silicon oxide layer or a silicon oxynitride layer was formed over a 1.1 mm-thick quartz substrate, and divided into samples of 20 mm×3 mm. Then, measurement was performed with the two samples overlapped.

The conditions of the samples on which the measurement was performed in this example are shown below.

The conditions for forming Sample 1 were as follows.
Film: silicon oxide
Film formation method: RF sputtering method
Target: silicon target
Film formation gas: Ar (10 sccm), $O_2$ (40 sccm)
Electric power: 3 kW (13.56 MHz)
Pressure: 0.6 Pa
T-S distance: 60 mm
Substrate temperature in film formation: room temperature
Thickness: 300 nm The conditions for forming Sample 2 were as follows.
Film: silicon oxide
Film formation method: RF sputtering method
Target: silicon target
Film formation gas: Ar (10 sccm), $O_2$ (40 sccm)
Electric power: 3 kW (13.56 MHz)
Pressure: 0.6 Pa
T-S distance: 60 mm
Substrate temperature in film formation: 100° C.
Thickness: 300 nm The conditions for forming Sample 3 were as follows.
Film: silicon oxide
Film formation method: RF sputtering method
Target: silicon target
Film formation gas: Ar (40 sccm), $O_2$ (10 sccm)
Electric power: 3 kW (13.56 MHz)
Pressure: 0.6 Pa
T-S distance: 60 mm
Substrate temperature in film formation: 100° C.
Thickness: 300 nm The conditions for forming Sample 4 were as follows.
Film: silicon oxide
Film formation method: RF sputtering method
Target: quartz target
Film formation gas: Ar (40 sccm), $O_2$ (10 sccm)
Electric power: 1.5 kW (13.56 MHz)
Pressure: 0.4 Pa
T-S distance: 60 mm
Substrate temperature in film formation: 100° C.
Thickness: 300 nm The conditions for forming Sample 5 were as follows.
Film: silicon oxynitride
Film formation method: plasma CVD method
Source gas: $SiH_4$ (25 sccm), $N_2O$ (1000 sccm)
Electric power: 35 W (13.56 MHz)
Pressure: 133.3 Pa
Electrode-substrate distance: 20 mm
Substrate temperature in film formation: 200° C.
Thickness: 300 nm Sample 6 was a quartz substrate for reference.

Not that for analysis by an ESR method, E500 CW-EPR spectrometer manufactured by Bruker BioSpin K.K. was used.

Figure 13:
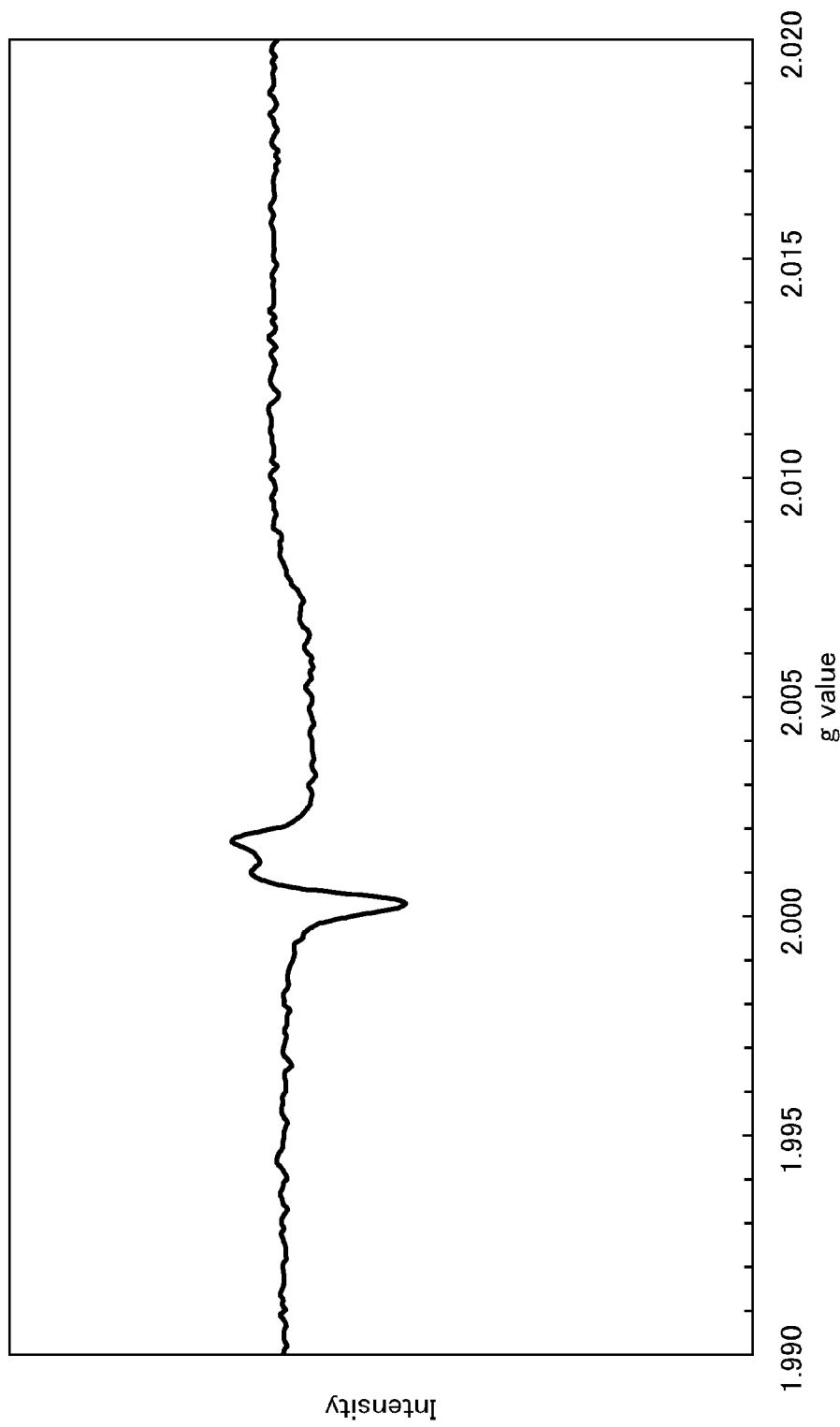
FIG. 13 shows a spectrum of a sample formed using one embodiment of the present invention, which is obtained by an electron spin resonance method.
Figure 14:
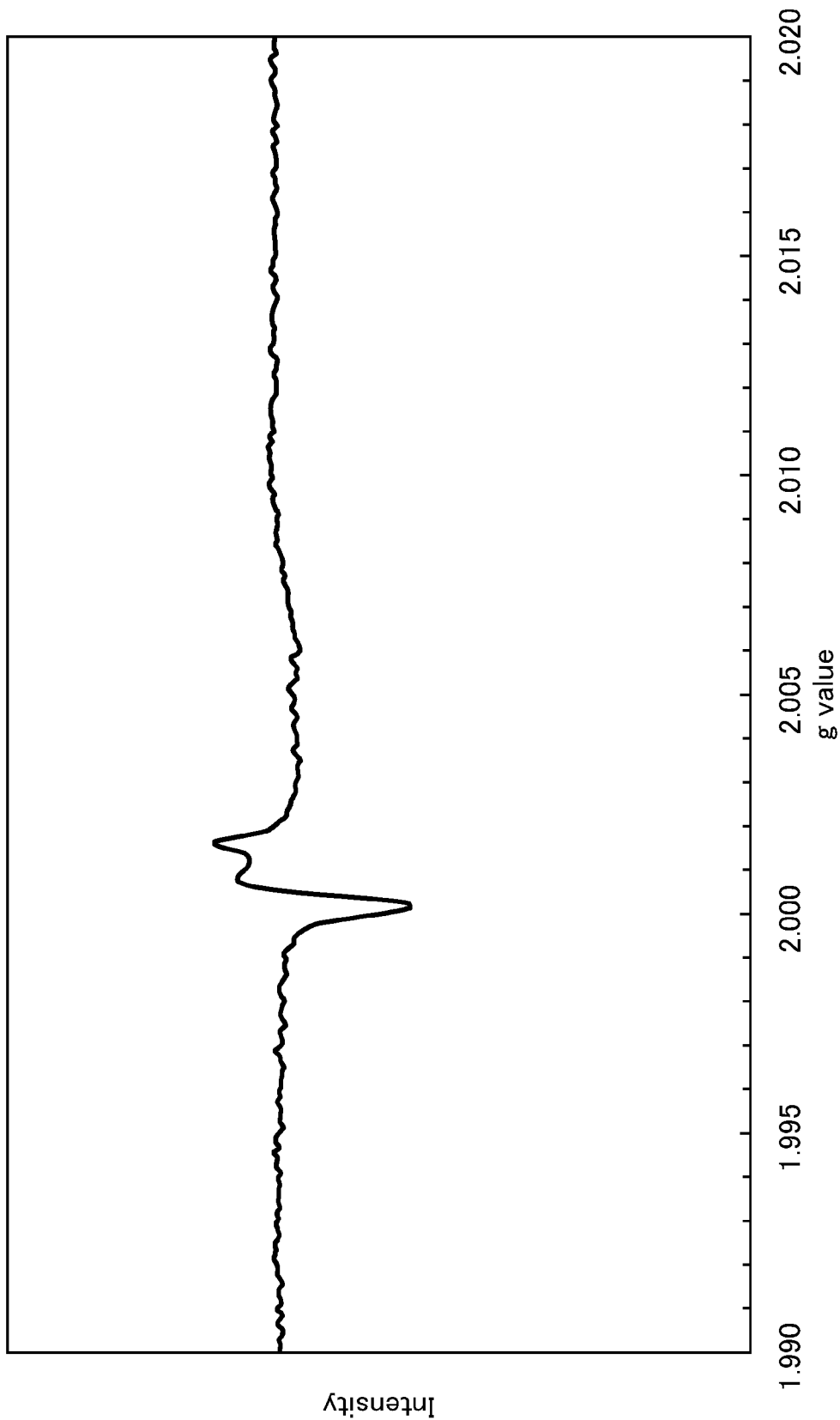
FIG. 14 shows a spectrum of a sample formed using one embodiment of the present invention, which is obtained by an electron spin resonance method.
Figure 15:
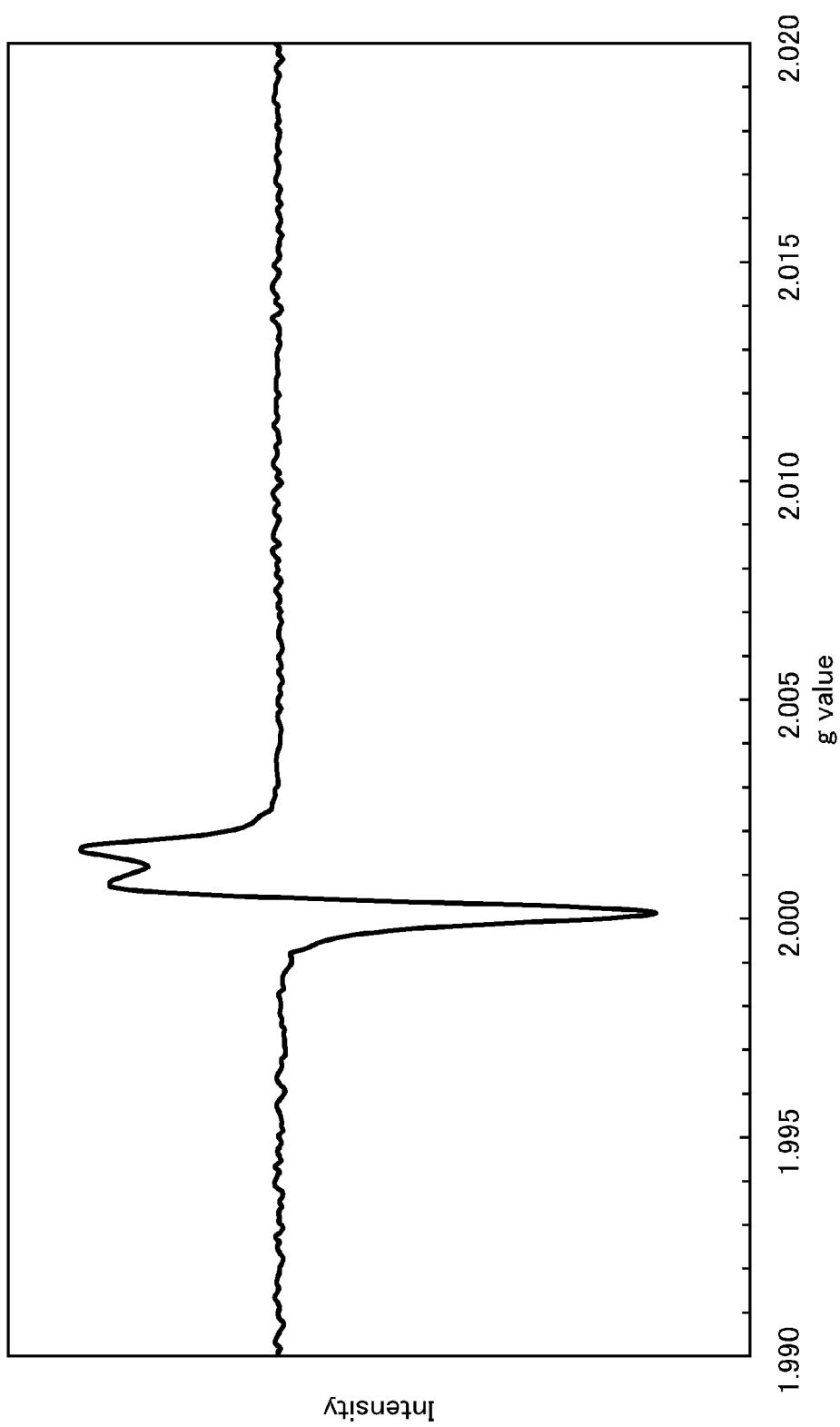
FIG. 15 shows a spectrum of a sample formed using one embodiment of the present invention, which is obtained by an electron spin resonance method.
Figure 16:
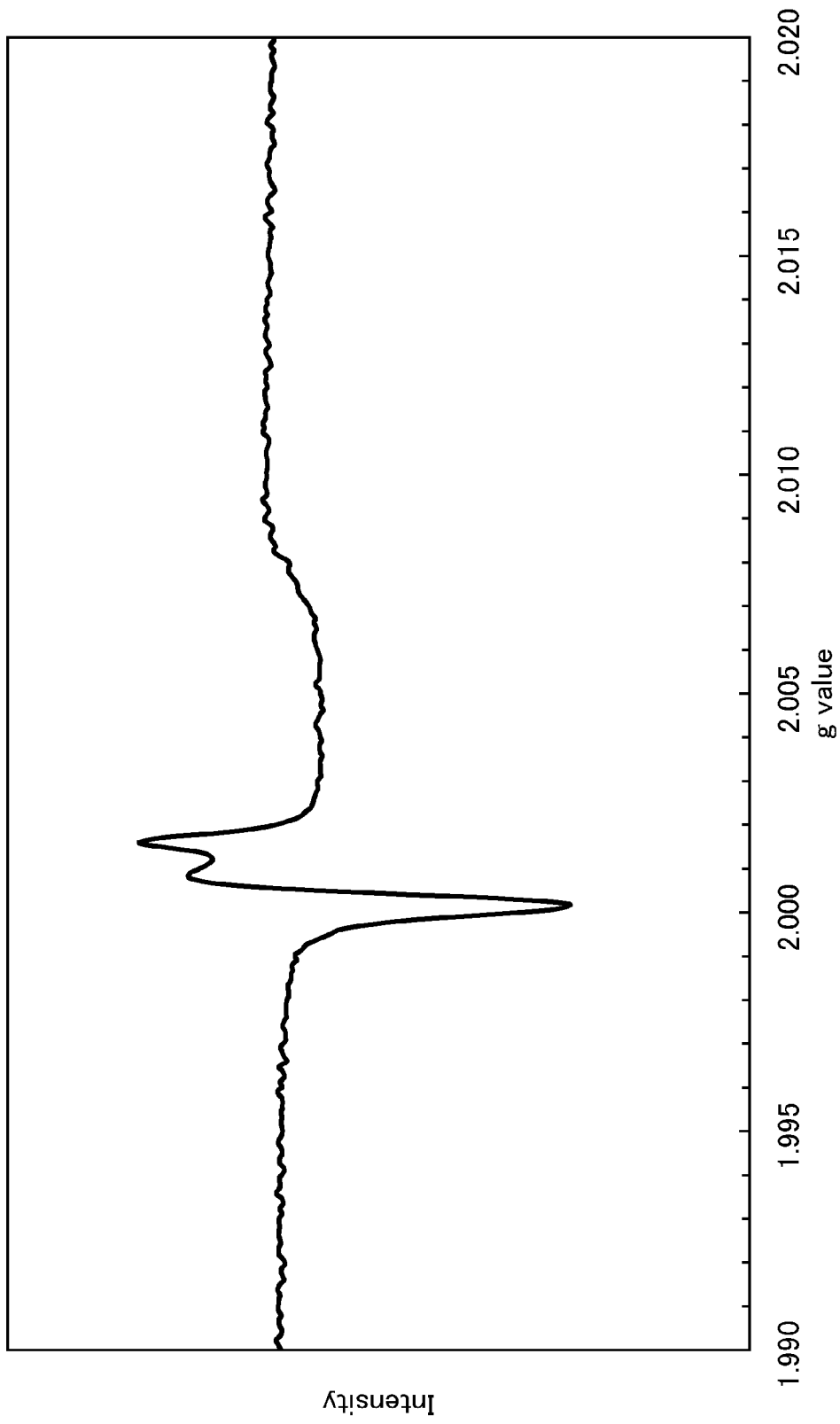
FIG. 16 shows a spectrum of a sample formed using one embodiment of the present invention, which is obtained by an electron spin resonance method.
Figure 17:
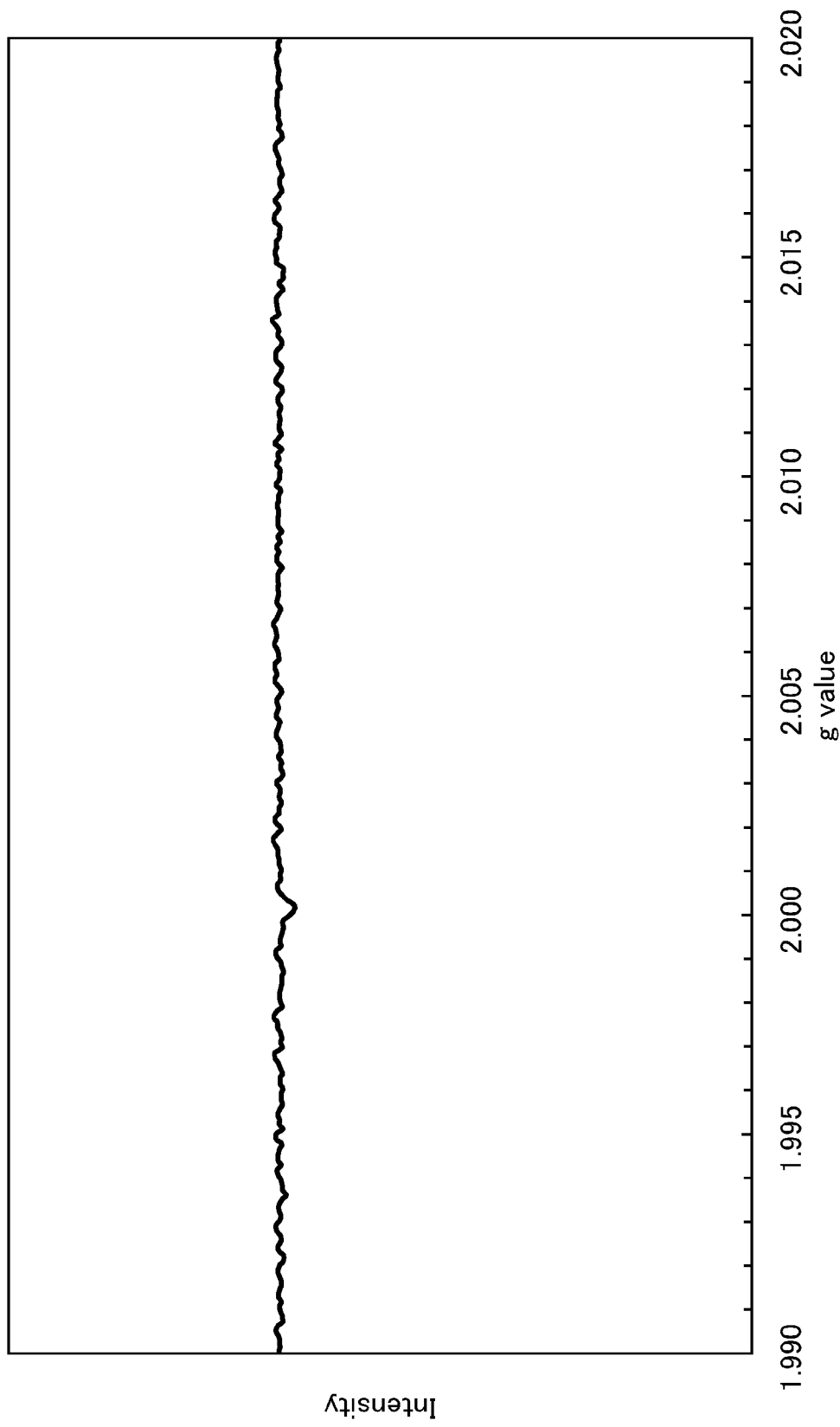
FIG. 17 shows a spectrum of a sample formed using one embodiment of the present invention, which is obtained by an electron spin resonance method.
Figure 18:
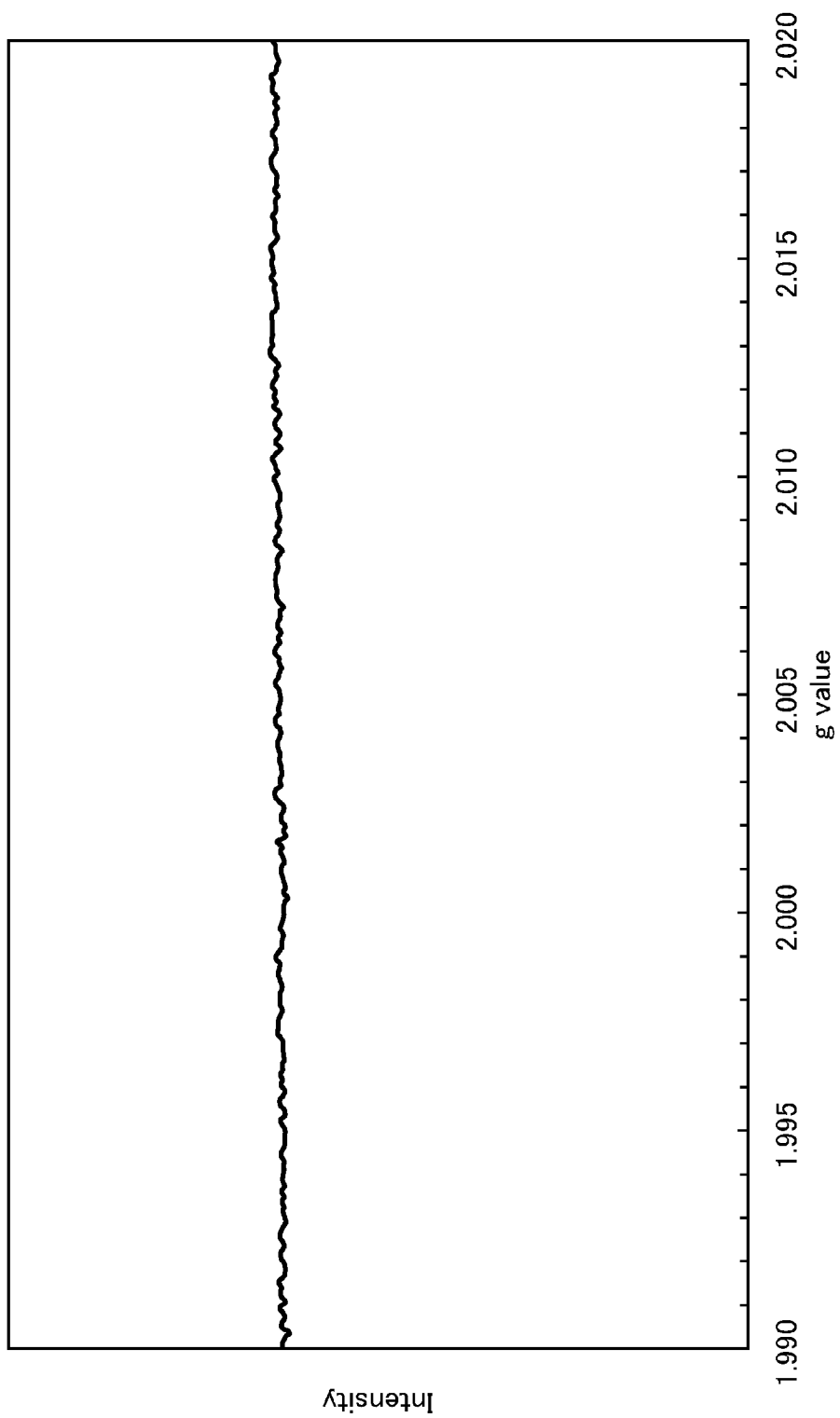
FIG. 18 shows a spectrum of a sample formed using one embodiment of the present invention, which is obtained by an electron spin resonance method.

FIG. 13 shows ESR analysis result of Sample 1. FIG. 14 shows ESR analysis result of Sample 2. FIG. 15 shows ESR analysis result of Sample 3. FIG. 16 shows ESR analysis result of Sample 4. FIG. 17 shows ESR analysis result of Sample 5. FIG. 18 shows ESR analysis result of Sample 6. Note that the measurement for ESR analysis was performed under conditions where the microwave electric power was 0.1 mW, Modulation Amplitude was 0.5 G, Conversion Time was 400 msec, the number of times scanned was 25, and the measurement temperature was room temperature.

Here, signals at g value=2.0003 and 2.0019 represent a silicon suboxide radical ((O—)$_3$Si.), and signals at g value=2.0016 and 2.0078 represent a silicon peroxide radical.

In Samples 1 to 4, silicon suboxide radicals were detected. In addition, in Samples 1, 2, and 4, silicon peroxide radicals were detected. In Samples 5 and 6, neither a silicon suboxide nor a silicon peroxide radical was detected. It was found that silicon peroxide radical was detected in the case even where the proportion of oxygen ($O_2/(O_2+Ar)$) was 20% and a quartz target was used, although a silicon peroxide radical was not detected in the case where the proportion of oxygen ($O_2/(O_2+Ar)$) was 20% and a silicon target was used. Further, in Sample 5 which was manufactured by a plasma CVD method, neither a silicon suboxide radical nor a silicon peroxide radical was detected. Note that Table 1 shows whether a silicon suboxide radical or a silicon peroxide radical was detected in Samples 1 to 6.

TABLE 1

| Sample | silicon suboxide radical | silicon peroxide radical |
|---|---|---|
| Sample 1 | detected | detected |
| Sample 2 | detected | detected |

TABLE 1-continued

| Sample | silicon suboxide radical | silicon peroxide radical |
|---|---|---|
| Sample 3 | detected | not detected |
| Sample 4 | detected | detected |
| Sample 5 | not detected | not detected |
| Sample 6 | not detected | not detected |

Thus, it is preferable to employ a sputtering method and use a quartz target to form an insulating layer having a silicon peroxide radical. In the case where a silicon target is used, it is preferable to increase the rate of $O_2/(O_2+Ar)$.

EXAMPLE 2

In this example, a transistor formed using one embodiment of the present invention is described.

Figure 19:
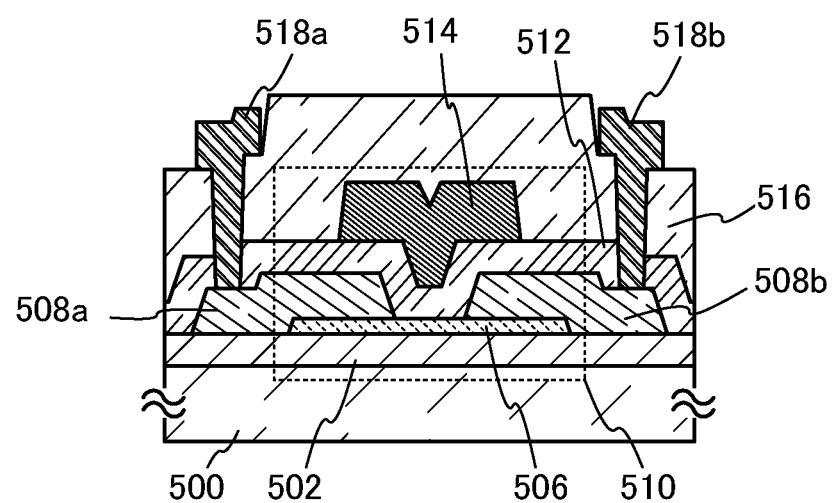
FIG. 19 is a cross-sectional view showing one mode of a semiconductor device which is one embodiment of the present invention.

FIG. 19 illustrates a structure of the transistor of this example.

The transistor in FIG. 19 includes a base insulating layer 502 provided over a substrate 500, an oxide semiconductor layer 506, a source electrode 508a and a drain electrode 508b, a gate insulating layer 512 provided over the source electrode 508a and the drain electrode 508b, a gate electrode 514 provided over the gate insulating layer 512, a protective insulating layer 516 provided over the gate electrode 514, and a source wiring 518a and a drain wiring 518b connected to the source electrode 508a and the drain electrode 508b, respectively, through openings provided in the protective insulating layer 516.

In this example, a 0.7-mm-thick glass substrate was used as the substrate 500, a 300-nm-thick silicon oxide layer was formed as the base insulating layer 502, a 30-nm-thick In—Ga—Zn—O-based non-single-crystal layer was formed as the oxide semiconductor layer 506, a 100-nm-thick tungsten layers were formed as the source electrode 508a and the drain electrode 508b, a 20-nm-thick silicon oxynitride layer was formed as the gate insulating layer 512, a stack of a 30-nm-thick tantalum nitride layer and a 370-nm-thick tungsten layer was formed as the gate electrode 514, a 300-nm-thick silicon oxide layer was formed as the protective insulating layer 516, and stacks of a 50-nm-thick titanium layer, a 100-nm-thick aluminum layer, and a 5-nm-thick titanium layer were formed as the source wiring 518a and the drain wiring 518b.

In the transistor of this example, a base insulating layer containing a silicon peroxide radical is used as the base insulating layer 502, whereby fluctuation in the threshold voltage and fluctuation in the threshold voltage after a BT test are reduced. In this example, a silicon oxide layer is used as the base insulating layer containing a silicon peroxide radical.

Other formation conditions of the silicon oxide layer were as follows.
Film formation method: RF sputtering method
Target: quartz target
Film formation gas: Ar (25 sccm), $O_2$ (25 sccm)
Electric power: 1.5 kW (13.56 MHz)
Pressure: 0.4 Pa
T-S distance: 60 mm
Substrate temperature: 100° C.

The formation conditions of the oxide semiconductor layer 506 in the transistor of this example were as follows.
Film formation method: DC sputtering method
Target: In—Ga—Zn—O ($In_2O_3$:$Ga_2O_3$:ZnO=1:1:2 [molar ratio]) target
Film formation gas: Ar (30 sccm), $O_2$ (15 sccm)
Electric power: 0.5 kW (DC)
Pressure: 0.4 Pa
T-S distance: 60 mm
Substrate temperature: 200° C.

After the oxide semiconductor layer 506 was formed, heat treatment was performed at 350° C. under a nitrogen atmosphere for an hour using a resistance heating furnace.

Figure 20:
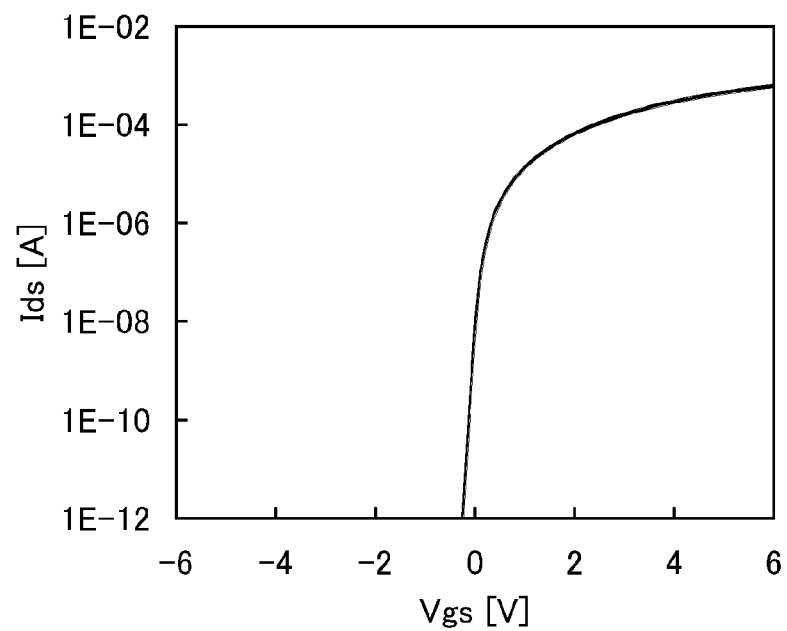
FIG. 20 shows a semiconductor device manufactured using one embodiment of the present invention.

FIG. 20 shows drain current (Ids)-gate voltage (Vgs) measurement results in the transistor of this example. Note that the measurement was performed at 25 points on a substrate surface. The measurement results of the 25 points are all shown in FIG. 20. The channel length L is 2 μm, and the channel width W is 50 μm. Note that the voltage Vds between the source electrode and the drain electrode of the transistor was set to 3 V.

According to FIG. 20, it was found that there was no variation in the substrate surface of the transistor of this example. Note that the average threshold voltage of the points was 0.27 V.

Next, the BT test in this example is described. The transistor on which the BT test is performed has a channel length L of 3 μm and a channel width W of 50 μm. In this example, first, the substrate temperature was set to 25° C. and the voltage Vds between the source electrode and the drain electrode was set to 3 V to perform the Ids-Vgs measurement of the transistor.

Figure 21A:
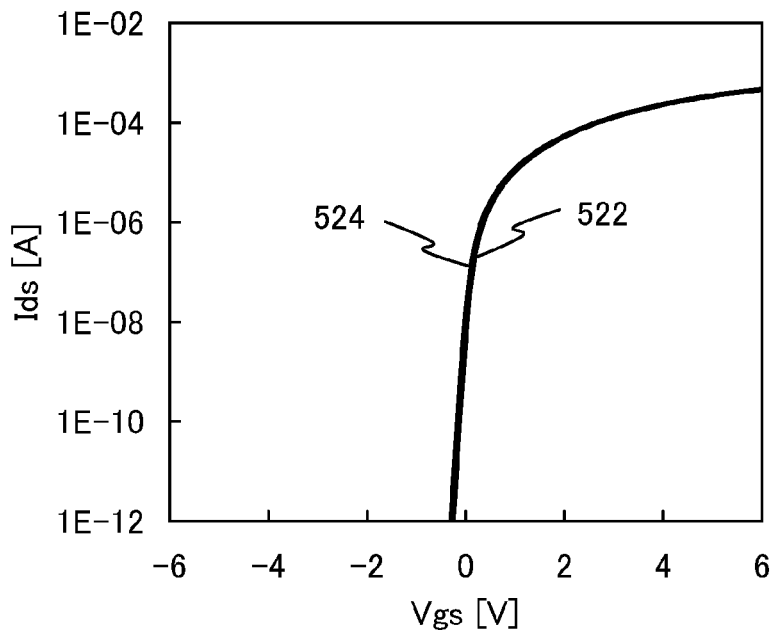
FIGS. 21A and 21B each show a semiconductor device manufactured using one embodiment of the present invention.

Next, the substrate stage temperature was set to 150° C., and the source electrode and the drain electrode of the transistor were set to 0 V and 0.1 V, respectively. Then, a negative voltage was applied to the gate electrode so that electric-field intensity applied to the gate insulating layer was 2 MV/cm, and the condition was kept for an hour. Next, the voltage of the gate electrode was set to 0 V. After that, the substrate temperature was set to 25° C. and the voltage Vds between the source electrode and the drain electrode was set to 3 V to perform the Ids-Vgs measurement of the transistor. FIG. 21A shows the Ids-Vgs measurement results before and after the BT test.

In FIG. 21A, a thin line 522 shows the Ids-Vgs measurement results before the BT test, and a thick line 524 shows the Ids-Vgs measurement results after the BT test. It is found that the threshold voltage fluctuates in a negative direction by 0.07 V after the BT test, as compared to the measurement results before the BT test.

In a similar manner, another transistor for measurement was prepared, and the substrate temperature was set to 25° C. and the voltage Vds between the source electrode and the drain electrode was set to 3 V to perform the Ids-Vgs measurement of the transistor. The channel length L of the transistor is 3 μm, and the channel width W thereof is 50 μm.

Figure 21B:
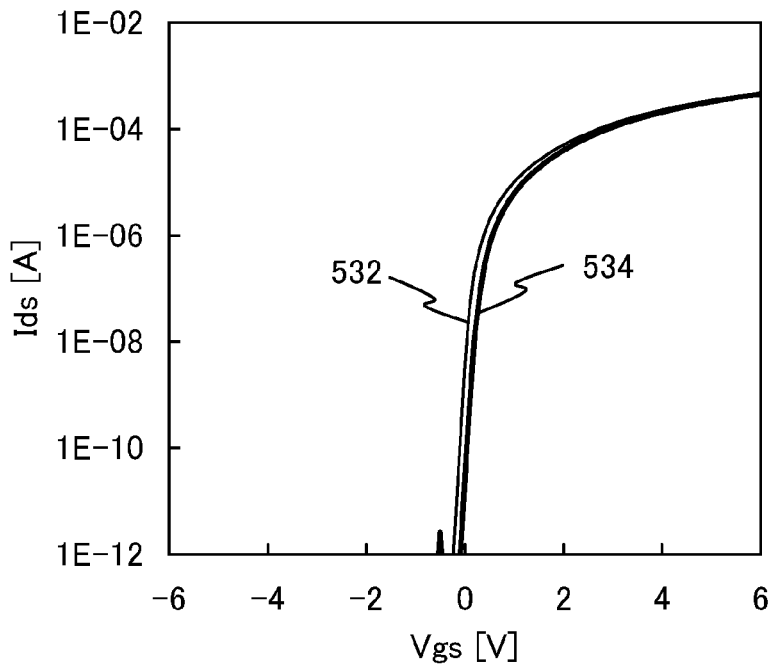

Next, the substrate stage temperature was set to 150° C., and the source electrode and the drain electrode of the transistor were set to 0 V and 0.1 V, respectively. Then, a negative voltage was applied to the gate electrode so that electric-field intensity applied to the gate insulating layer was 2 MV/cm, and the condition was kept for an hour. Next, the voltage of the gate electrode was set to 0 V. After that, the substrate temperature was set to 25° C. and the voltage Vds between the source electrode and the drain electrode was set to 3 V to perform the Ids-Vgs measurement of the transistor. FIG. 21B shows the Ids-Vgs measurement results before and after the BT test.

In FIG. 21B, a thin line 532 shows the Ids-Vgs measurement results before the BT test, and a thick line 534 shows the Ids-Vgs measurement results after the BT test. It is found that the threshold voltage fluctuates in a positive direction by 0.19 V after the BT test, as compared to the measurement results before the BT test.

As described above, it is found that the transistor of this example has small variation in the threshold voltage of the substrate surface and small fluctuation in the threshold voltage between before and after a BT test.

This application is based on Japanese Patent Application Serial No. 2010-117753 filed with the Japan Patent Office on May 21, 2010, the entire contents of which are hereby incorporated by reference.

The invention claimed is:

1. A semiconductor device comprising:
a substrate;
a gate electrode;
an oxide semiconductor layer comprising indium and zinc;
a source electrode and a drain electrode electrically connected to the oxide semiconductor layer;
a first insulating layer between the gate electrode and the oxide semiconductor layer; and
a second insulating layer comprising a silicon peroxide radical,
wherein the oxide semiconductor layer is provided between the first insulating layer and the second insulating layer,
wherein the second insulating layer is in contact with the oxide semiconductor layer, and
wherein the oxide semiconductor layer is dehydrated or dehydrogenated.

2. The semiconductor device according to claim 1,
wherein the gate electrode overlaps with the oxide semiconductor layer with the first insulating layer interposed therebetween, and
wherein the oxide semiconductor layer is provided between the gate electrode and the substrate.

3. The semiconductor device according to claim 1, wherein the source electrode and the drain electrode are provided between the first insulating layer and the oxide semiconductor layer.

4. The semiconductor device according to claim 1, wherein the source electrode and the drain electrode are provided between the second insulating layer and the oxide semiconductor layer.

5. The semiconductor device according to claim 1,
wherein the oxide semiconductor layer overlaps with the gate electrode with the first insulating layer interposed therebetween, and
wherein the gate electrode is provided between the substrate and the oxide semiconductor layer.

6. The semiconductor device according to claim 1, wherein the first insulating layer comprises a silicon peroxide radical.

7. The semiconductor device according to claim 1,
wherein the oxide semiconductor layer comprises a channel region, a source region and a drain region, and
wherein the source region and the drain region have lower resistance than the channel region.

8. The semiconductor device according to claim 1, wherein the silicon peroxide radical comprises the structure represented by Si—O—O●.

9. The semiconductor device according to claim 1, wherein the first insulating layer comprising the silicon peroxide radical has signals at g value=2.0016 and 2.0078 in a spectrum obtained by an electron spin resonance method.

10. The semiconductor device according to claim 1, wherein a hydrogen concentration of the oxide semiconductor layer is lower than $1 \times 10^{18}$ cm$^{-3}$.

11. The semiconductor device according to claim 1, wherein a carrier concentration of the oxide semiconductor layer is lower than $1 \times 10^{14}$ cm$^{-3}$.

12. A semiconductor device comprising an insulating layer in contact with an oxide semiconductor layer,
wherein the oxide semiconductor layer comprises indium and zinc,
wherein the insulating layer comprises a silicon peroxide radical, and
wherein the oxide semiconductor layer is dehydrated or dehydrogenated.

13. The semiconductor device according to claim 12, wherein the silicon peroxide radical comprises the structure represented by Si—O—O●.

14. The semiconductor device according to claim 12, wherein the insulating layer has signals at g value=2.0078 and 2.0016 in a spectrum obtained by an electron spin resonance method.

15. The semiconductor device according to claim 12, wherein a hydrogen concentration of the oxide semiconductor layer is lower than $1 \times 10^{18}$ cm$^{-3}$.

16. The semiconductor device according to claim 12, wherein a carrier concentration of the oxide semiconductor layer is lower than $1 \times 10^{14}$ cm$^{-3}$.

* * * * *